(12) United States Patent
Jang et al.

(10) Patent No.: US 11,043,438 B2
(45) Date of Patent: Jun. 22, 2021

(54) CHIP ON FILM PACKAGE AND DISPLAY DEVICE INCLUDING THE SAME

(71) Applicant: Samsung Display Co., LTD., Yongin-si (KR)

(72) Inventors: Sehui Jang, Yongin-si (KR); Jihyun Kim, Yongin-si (KR); Chongguk Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 52 days.

(21) Appl. No.: 16/221,697

(22) Filed: Dec. 17, 2018

(65) Prior Publication Data

US 2019/0198412 A1   Jun. 27, 2019

(30) Foreign Application Priority Data

Dec. 27, 2017   (KR) .................. 10-2017-0181457

(51) Int. Cl.
| | |
|---|---|
| *H01L 23/31* | (2006.01) |
| *H01L 23/498* | (2006.01) |
| *H05K 1/02* | (2006.01) |
| *G02F 1/1345* | (2006.01) |
| *H01L 27/12* | (2006.01) |
| *H01L 27/32* | (2006.01) |
| *G02F 1/1362* | (2006.01) |
| *G02F 1/1333* | (2006.01) |
| *H01L 23/00* | (2006.01) |

(52) U.S. Cl.
CPC ........ *H01L 23/3114* (2013.01); *G02F 1/1333* (2013.01); *G02F 1/13452* (2013.01); *G02F 1/136286* (2013.01); *H01L 23/4985* (2013.01); *H01L 27/124* (2013.01); *H01L 27/3244* (2013.01); *H05K 1/028* (2013.01); *H01L 23/562* (2013.01)

(58) Field of Classification Search
CPC .................. H01L 23/3114; H01L 23/4985
See application file for complete search history.

(56) References Cited

U.S. PATENT DOCUMENTS 9,664,964 B2 * 5/2017 Lee ................. H01L 23/4985
2007/0138654 A1 * 6/2007 Kim ................... H05K 3/323
257/786

(Continued)

FOREIGN PATENT DOCUMENTS

KR   1020120088332 A   8/2012

*Primary Examiner* — Khaja Ahmad
*Assistant Examiner* — Khatib A Rahman
(74) *Attorney, Agent, or Firm* — Cantor Colburn LLP

(57) ABSTRACT

A chip on film package includes a driving integrated circuit chip; a base substrate including: a driving integrated circuit region, and a first region at which stress is converged by the base substrate bent along a side surface of the display panel; and an electrical ground pattern structure on the base substrate in the first region thereof at which the stress is converged. The electrical ground pattern structure is connected to a first side of the driving integrated circuit chip, and the ground pattern structure includes extended from the first side of the driving integrated circuit chip: in a first portion of the first region, ground patterns each inclined in a first direction, and in a second portion of the first region, ground patterns each inclined in a second direction different from the first direction.

20 Claims, 12 Drawing Sheets

(56) References Cited

U.S. PATENT DOCUMENTS

| | | | | |
|---|---|---|---|---|
| 2007/0152329 A1* | 7/2007 | Cho | ............... | H01L 24/06 |
| | | | | 257/734 |
| 2010/0038117 A1* | 2/2010 | Chung | ............ | H05K 1/114 |
| | | | | 174/254 |
| 2014/0036456 A1* | 2/2014 | Jung | ............ | G02F 1/13452 |
| | | | | 361/749 |
| 2015/0311148 A1* | 10/2015 | Jung | ........... | H01L 23/49838 |
| | | | | 361/767 |
| 2016/0088726 A1* | 3/2016 | Jeon | ............ | H05K 1/147 |
| | | | | 361/749 |
| 2016/0218065 A1* | 7/2016 | Ha | ............ | H01L 23/4985 |

\* cited by examiner

CHIP ON FILM PACKAGE AND DISPLAY DEVICE INCLUDING THE SAME

This application claims priority to Korean Patent Application No. 10-2017-0181457, filed on Dec. 27, 2017 and all the benefits accruing therefrom under 35 U.S.C. § 119, the content of which is incorporated herein in its entirety by reference.

BACKGROUND

1. Field

Exemplary embodiments relate generally to a chip on film package and a display device including the chip on film package. More particularly, embodiments of the invention relate to a chip on film package including an electrical ground pattern structure and display device including the chip on film package.

2. Description of the Related Art

A flat panel display ("FPD") device is widely used as a display device of an electronic device because the FPD device is relatively lightweight and thin compared to a cathode-ray tube ("CRT") display device. Typical examples of the FPD device are a liquid crystal display ("LCD") device and an organic light emitting display ("OLED") device.

A display panel included in a display device may receive electrical scan signals, data signals, etc. from a device external to the display panel so as to display an image. Here, the display panel and the external device may be connected through a flexible printed circuit board (e.g., a chip on film). To reduce a dead space of the display panel at which no component thereof is disposed, the external device may be positioned at a lower surface (e.g., a non-display region) of the display panel when the display panel displays the image at an upper surface opposite to the lower surface.

SUMMARY

One or more exemplary embodiment provides a chip on film package with which a display panel of a display device may be connected to an external signal-providing device.

One or more exemplary embodiment provides a display device including the chip on film package.

According to one or more exemplary embodiment, a chip on film package includes: a driving integrated circuit chip from which an electronic signal is provided to a display panel for displaying an image; a base substrate including: a driving integrated circuit region in which the driving integrated circuit chip is disposed on the base substrate, and a first region at which stress is converged by the base substrate bent along a side surface of the display panel, located at a first side of the driving integrated circuit region; and an electrical ground pattern structure with which the driving integrated circuit is electrically grounded, on the base substrate in the first region thereof at which the stress is converged. The electrical ground pattern structure is connected to a first side of the driving integrated circuit chip which corresponds to the first side of the driving integrated circuit region, and the ground pattern structure includes extended from the first side of the driving integrated circuit chip, a plurality of ground patterns including: in a first portion of the first region, ground patterns each inclined in a first direction with respect to the first side of the driving integrated circuit chip, and in a second portion of the first region which is directly adjacent to the first portion along the first side of the driving integrated circuit chip, ground patterns each inclined in a second direction with respect to the first side of the driving integrated circuit chip, the second direction being different from the first direction.

In exemplary embodiments, the ground patterns extending inclined in the first direction may be spaced apart from each other along the first side of the driving integrated circuit chip, and may have different lengths from each other, and the ground patterns extending inclined in the second direction may be spaced apart from each other along the first side of the driving integrated circuit chip, and may have different lengths to each other.

In exemplary embodiments, the ground patterns extending inclined in the first direction and the ground patterns extending inclined in the second direction may be symmetric to each other with respect to a center of the driving integrated circuit region along the first side thereof.

In exemplary embodiments, a plane may be defined by the first and second directions, and in a top view of the plane, the driving integrated circuit chip may include: the first side lengthwise extending in a third direction crossing each of the first and second directions, a second side facing the first side, a third side extending in a fourth direction that is perpendicular to the third direction, and a fourth side facing the third side.

In exemplary embodiments, lengths of the first and second sides of the driving integrated circuit chip may be greater than lengths of third and fourth sides of the driving integrated circuit chip, and the first region may have a shape of an inverted triangle corresponding to an overall shape defined by the plurality of ground patterns.

In exemplary embodiments, each of the plurality of ground patterns within the ground pattern structure may be in contact with the first side of the driving integrated circuit chip, and ends of the plurality of ground patterns may be aligned with each other along the first side of the driving integrated circuit chip.

In exemplary embodiments, the ground patterns extending inclined in the first direction and the ground patterns extending inclined in the second direction may be symmetric to each other with respect to a center of the driving integrated circuit chip along the third direction.

In exemplary embodiments, the ground patterns extending inclined in the first direction and the ground patterns extending inclined in the second direction may be spaced apart from each other along the fourth direction.

In exemplary embodiments, the base substrate may further include a second region located at a second side of the driving integrated circuit region opposite to the first side thereof; third regions spaced apart from each other along the third direction, respectively at opposing sides the second region along the third direction, the third regions respectively extending to be disposed at opposing sides of the first region along the third direction; and a fourth region located between the second region and each of the third regions along the third direction, respectively, the fourth region extending to be disposed at opposing sides of the first region along the third direction.

In exemplary embodiments, the chip on film package may further include first input wirings which transmit input signals to the integrated circuit chip from outside the chip on film package, disposed on the base substrate in the second region thereof, the first input wirings being spaced apart from each other along the third direction and connected to the second side of the driving integrated circuit chip; second input wirings which transmit input signals to the display panel from outside the chip on film package, disposed on the base substrate in each of the third regions thereof, the second input wirings being spaced apart from each other along the third direction; and output wirings which transmit the input signals from the integrated circuit chip to the display panel, disposed on the base substrate in the fourth region thereof, the output wirings being spaced apart from each other along the third direction and connected to the driving integrated circuit chip, where the second input wirings are electrically disconnected from the output wirings.

In exemplary embodiments, the first input wirings may be in contact with a portion of the second side of the driving integrated circuit chip, and the first and second ground patterns may each be in contact with a portion of the first side of the driving integrated circuit chip, the output wirings may be in contact with a remaining portion of the first side of the driving integrated circuit chip excluding the portion in contact with the plurality of ground patterns, a remaining portion of the second side of the driving integrated circuit chip excluding the portion in contact with the first input wirings, the third side and the fourth side of the driving integrated circuit chip, and in the top view of the plane defined by the first and second directions, at the first side of the driving integrated circuit chip, end portions of the output wirings and end portions of the plurality of the ground patterns may be disposed parallel to each other.

In exemplary embodiments, the plurality of ground patterns may include first through (M)th ground patterns, where M is integer greater than 1. (K)th and (K+1)th ground patterns among the first through (M)th ground patterns may be symmetric to each other with respect to a center of the first region along the first side of the driving integrated circuit region, where K is integer between 1 and M.

In exemplary embodiments, the (K)th ground pattern may be extended inclined in the first direction, and the (K+1)th ground pattern may be extended inclined in the second direction. The (K)th and (K+1)th ground patterns may form a V shape.

In exemplary embodiments, the (K)th and (K+1)th ground patterns may have a same length as each other.

In exemplary embodiments, first distal ends of each of the (K)th and (K+1)th ground patterns may be aligned with each other at the first side of the driving integrated circuit chip adjacent to each other, and second distal ends which oppose the first distal ends thereof, may be adjacent to each other in a direction away from the driving integrated circuit chip.

In exemplary embodiments, a (2M−1)th ground pattern among the first through (M)th ground patterns may be disposed in the first portion of the first region, and a (2M)th ground pattern among the first through (M)th ground patterns may be disposed in the second portion of the first region. Lengths of the (2M−1)th and (2M)th ground patterns may decrease in a direction toward a center of the first side of the driving integrated circuit chip.

According to some exemplary embodiments, a chip on film package includes: a driving integrated circuit chip from which a signal is provided to a display panel for displaying an image; and a base substrate including: a driving integrated circuit region in which the driving integrated circuit chip is disposed on the base substrate, a first input region in which a first input wiring through which a first input signal is transmitted to the driving integrated circuit chip from outside the chip on film package is disposed on the base substrate, the first input region disposed at a first side of the driving integrated circuit region, second input regions in which a second input wiring through which a second input signal is transmitted to the display panel from outside the chip on film package is disposed on the substrate, the second input regions spaced apart from each other and located at opposing sides of the first input region along the first side of the driving integrated circuit chip region, respectively, an output region, in which an output wiring through which an output signal is transmitted from the integrated circuit chip to the display panel is disposed on the base substrate, the output region located between the driving integrated circuit region and each of the second input regions, respectively, and a first region, located at a second side of the driving integrated circuit region which is opposite to the first side thereof, the first region being surrounded by the driving integrated circuit region and the output region. The electrical ground pattern structure is disposed in at least one region among the first input region, the second input region, the output region and the first region of the base substrate, and the electrical ground pattern structure includes a plurality of ground patterns including: ground patterns inclined in a first direction and ground patterns inclined in a second direction that is different from the first direction.

In exemplary embodiments, the region in which the electrical ground pattern structure is disposed may be a region among the first input region, the second input region, the output region and the first region at which stress is converged by the base substrate bent along a side surface of the display panel.

In exemplary embodiments, the electrical ground pattern structure may be disposed is the first region surrounded by the driving integrated circuit region and the output region, and with respect to the second side of the driving integrated circuit region, each of the ground patterns extended in the first direction and each of the ground patterns extended in the second direction may be spaced apart from the driving integrated circuit chip.

According to some exemplary embodiments, a display device including a plurality of pixel structures with which an image is displayed by the display panel; an external device which generates a plurality of signals for controlling the pixel structures to display the image; and a chip on film package through which the signals are provided to the display panel from the external device, connected to a first end of the display panel and bendable along a side surface of the display panel. The chip on film package includes: a driving integrated circuit chip from which an output signal is provided to the display panel from the external device, a base substrate including: a driving integrated circuit region in which the driving integrated circuit is disposed on the base substrate, a first region at which stress is converged by the base substrate bent along the side surface of the display panel, located at a first side of the driving integrated circuit region; and an electrical ground pattern structure with which the driving integrated circuit is electrically grounded, on the base substrate in the first region thereof. The electrical ground pattern structure is connected to a first side of the driving integrated circuit chip which corresponds to the first side of the driving integrated circuit region, and the ground pattern structure includes extended from the first side of the driving integrated circuit chip, a plurality of ground patterns including: in a first portion of the first region, ground patterns each inclined in a first direction with respect to the first side of the driving integrated circuit chip, and in a second portion of the first region which is directly adjacent to the first portion along the first side of the driving integrated circuit chip, ground patterns each inclined in a second direction with respect to the first side of the driving integrated circuit chip, the second direction being different from the first direction.

In the chip on film package in accordance with exemplary embodiments, when the chip on film package is bent or twisted, a stress may be converged in the first region. As the ground pattern structure has the first and second inclined (diagonal) shapes disposed in the first region, the stress may be relatively reduced in the first region. Accordingly, wirings included in the chip on film package may not be damaged or separated such as being cut.

The chip on film package included in the display device according to exemplary embodiments is bent or twisted to place the external device on the lower surface of the display panel, such that a stress may be converged in the first region. As the ground pattern structure has the first and second diagonal shapes in the first region, the stress may be reduced in the first region. Accordingly, wirings included in the chip on film package may not be damaged such as being separated or cut.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
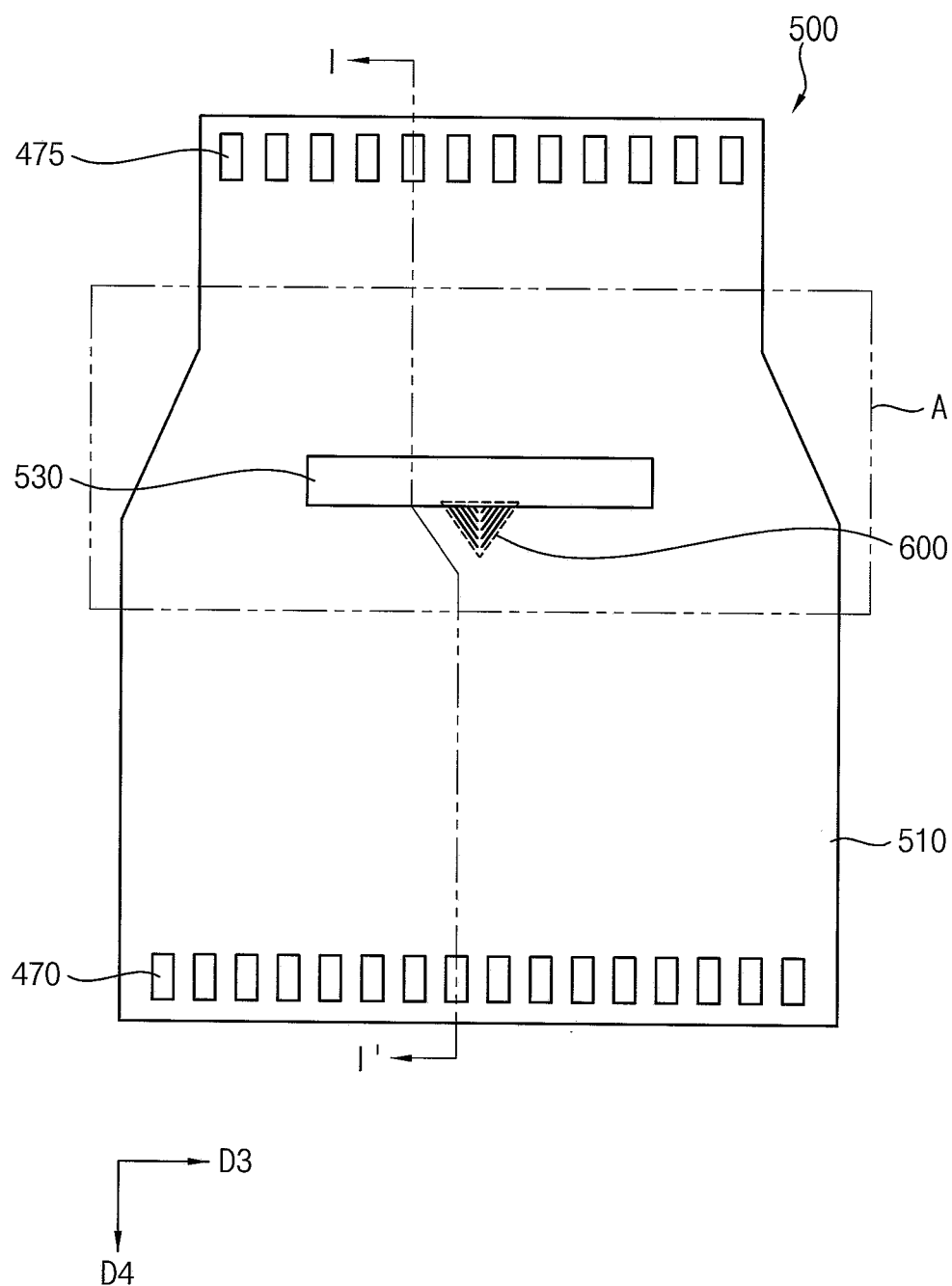
FIG. 1 is a top plan view illustrating an exemplary embodiment of a chip on film package in accordance with the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be explained in detail with reference to the accompanying drawings.

Where an external device generating and/or providing control or power signals (e.g., electrical scan signals, data signals, etc.) to a display panel is positioned at a lower surface (e.g., a non-display region) of the display panel which is opposite to an upper surface thereof at which an image is displayed, a flexible printed circuit board (e.g., a chip on film) may be bent or twisted. In this case, in the bending or twisting of the chip on film, a stress (e.g., tensile, compressive, etc.) is converged on a portion of the chip on film. As a result, conductive or electrical wirings that are disposed in the chip on film may be damaged such as being separated or cut.

Figure 2:
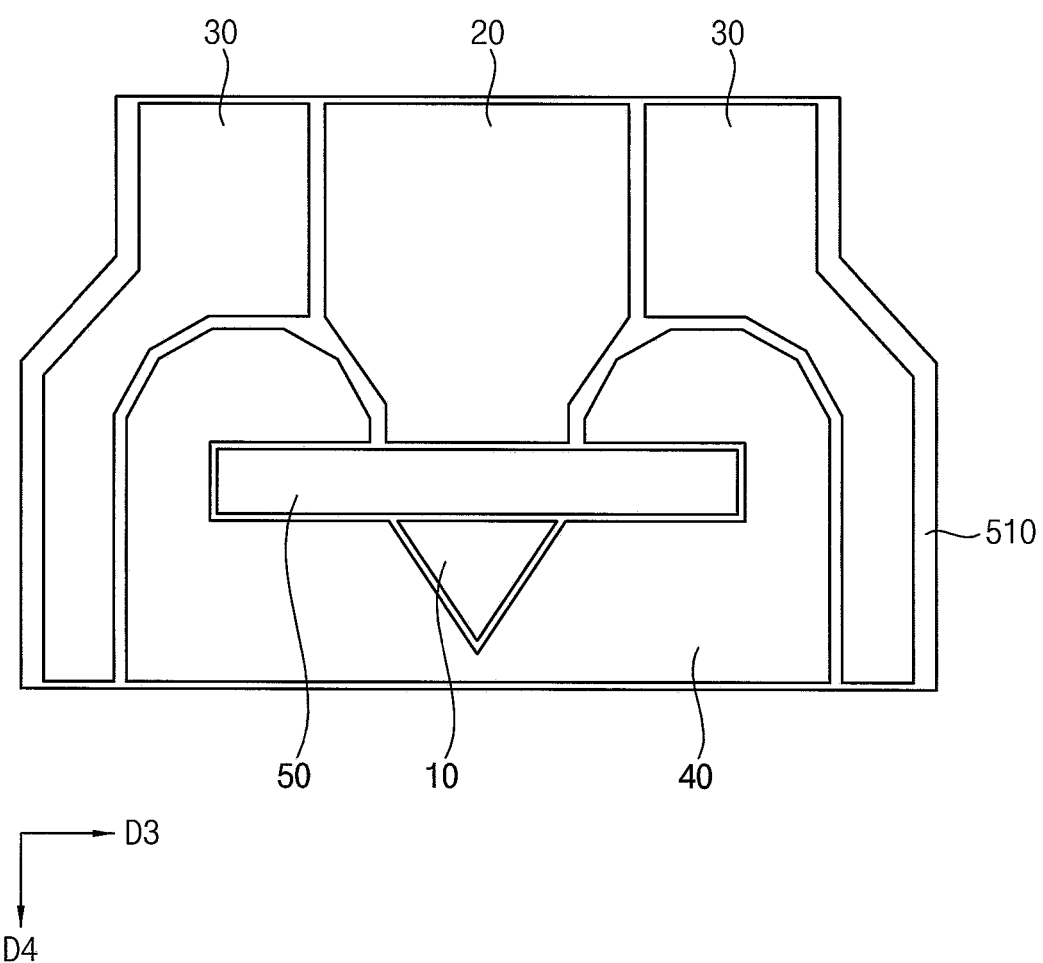
FIG. 2 is an enlarged top plan view of an exemplary embodiment of regions included within the region 'A' of the chip on film package of FIG. 1 in accordance with the invention.
Figure 3:
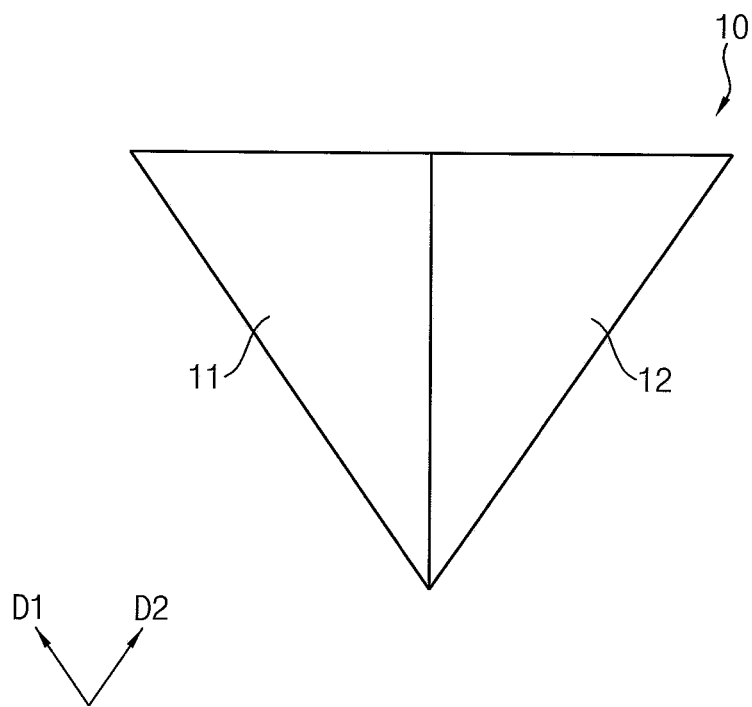
FIG. 3 is a top plan view of an exemplary embodiment of first and second portions of a first region included in the chip on film package of FIG. 2.
Figure 4:
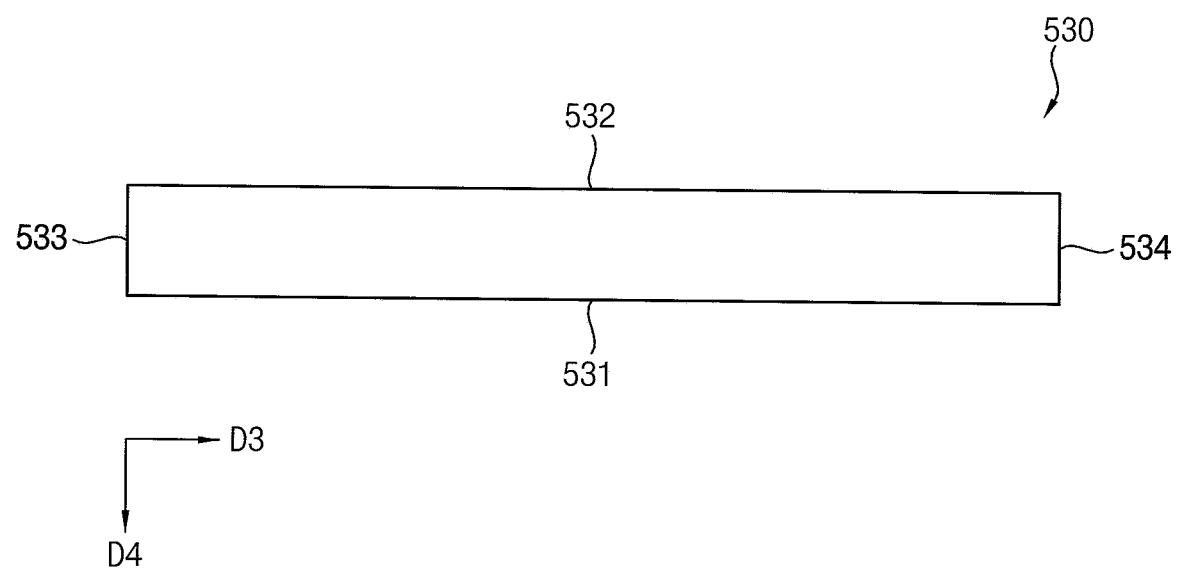
FIG. 4 is a top plan view of an exemplary embodiment of a driving integrated circuit ("IC") chip included in the chip on film package of FIG. 1.
Figure 5A:
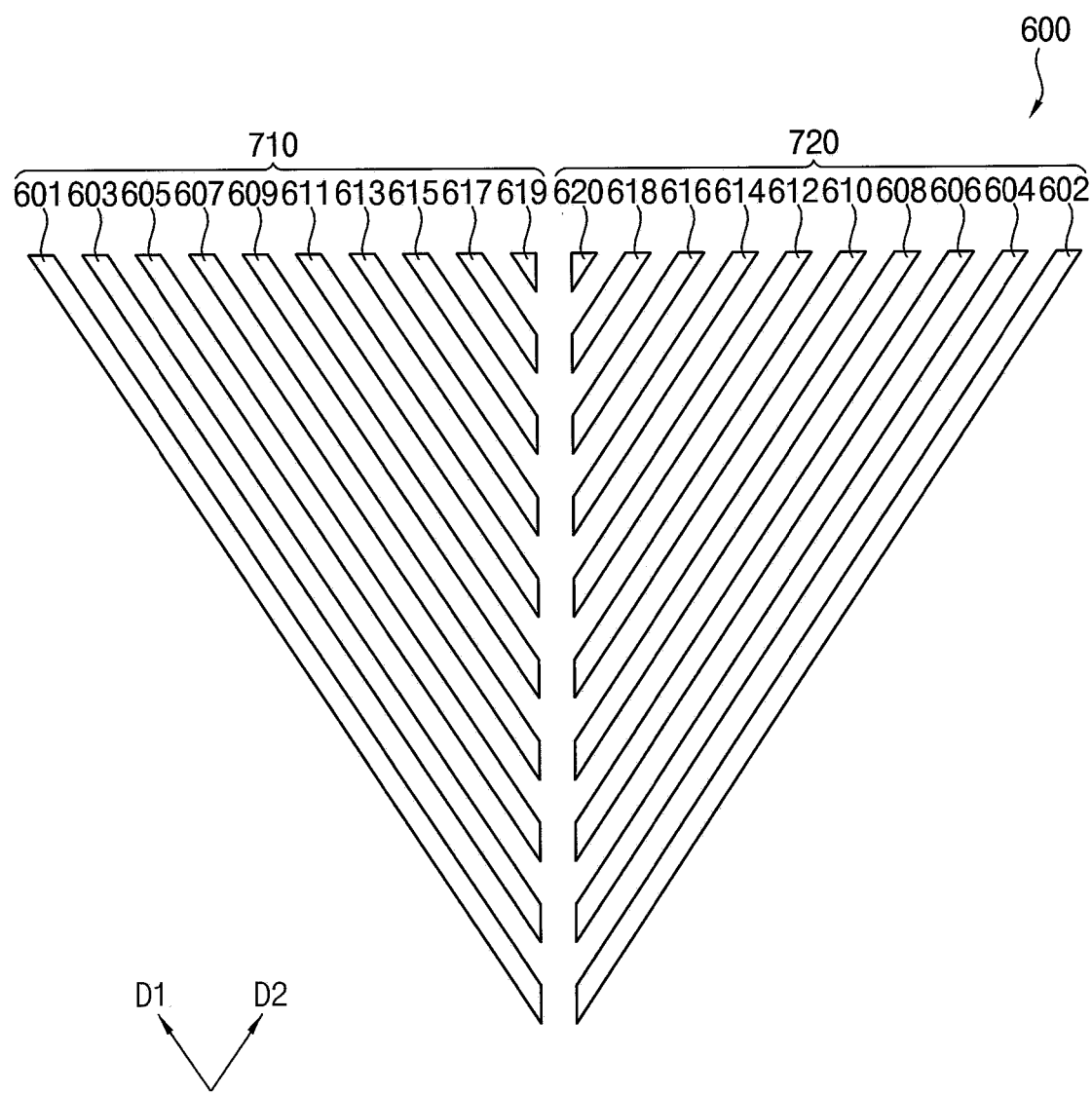
FIG. 5A is an enlarged top plan view illustrating an exemplary embodiment of an electrical ground pattern structure included in the chip on film package of FIG. 1.
Figure 5B:
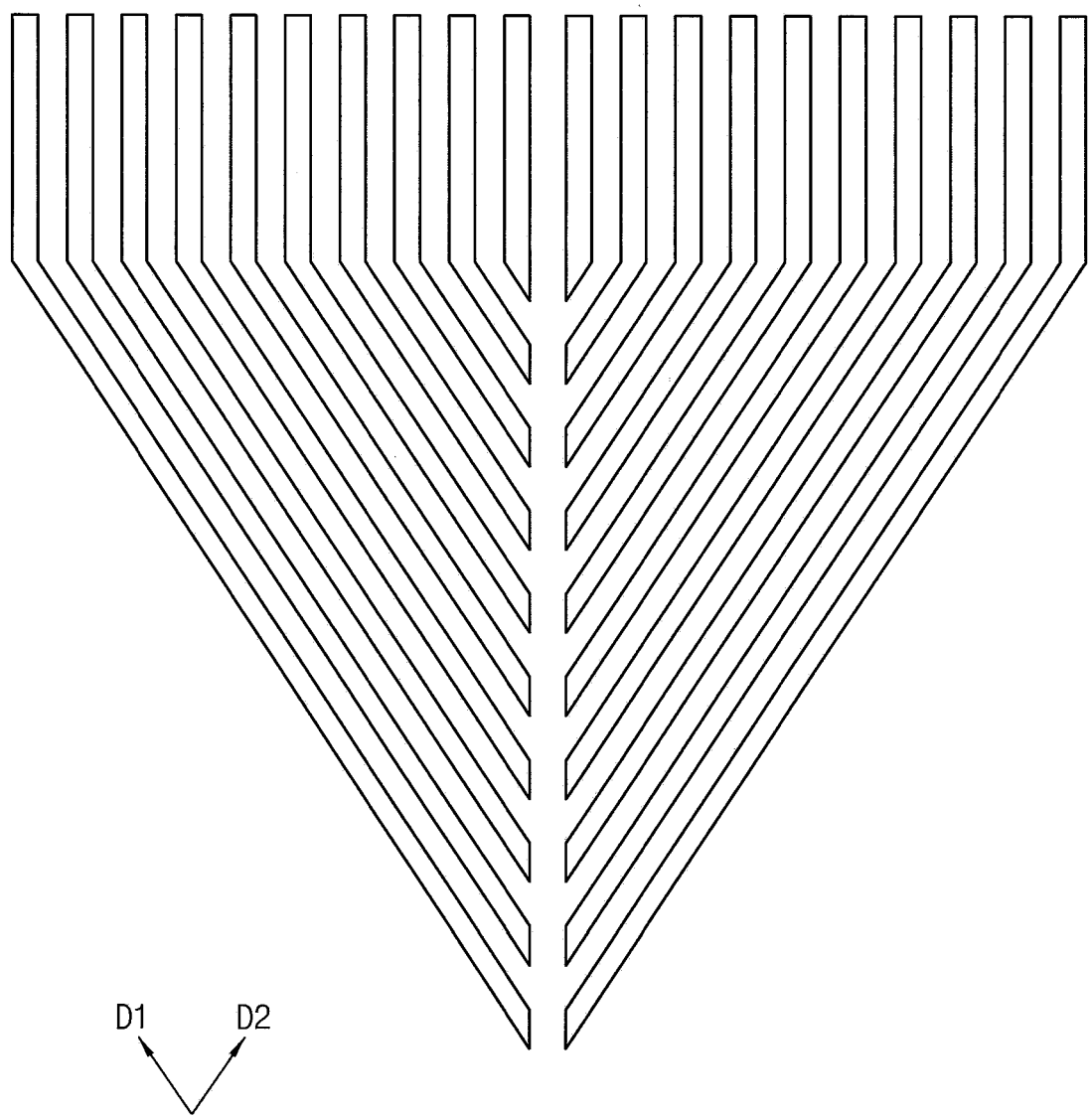
FIG. 5B is an enlarged top plan view illustrating a modified exemplary embodiment of an electrical ground pattern structure included in the chip on film package of FIG. 1.
Figure 6:
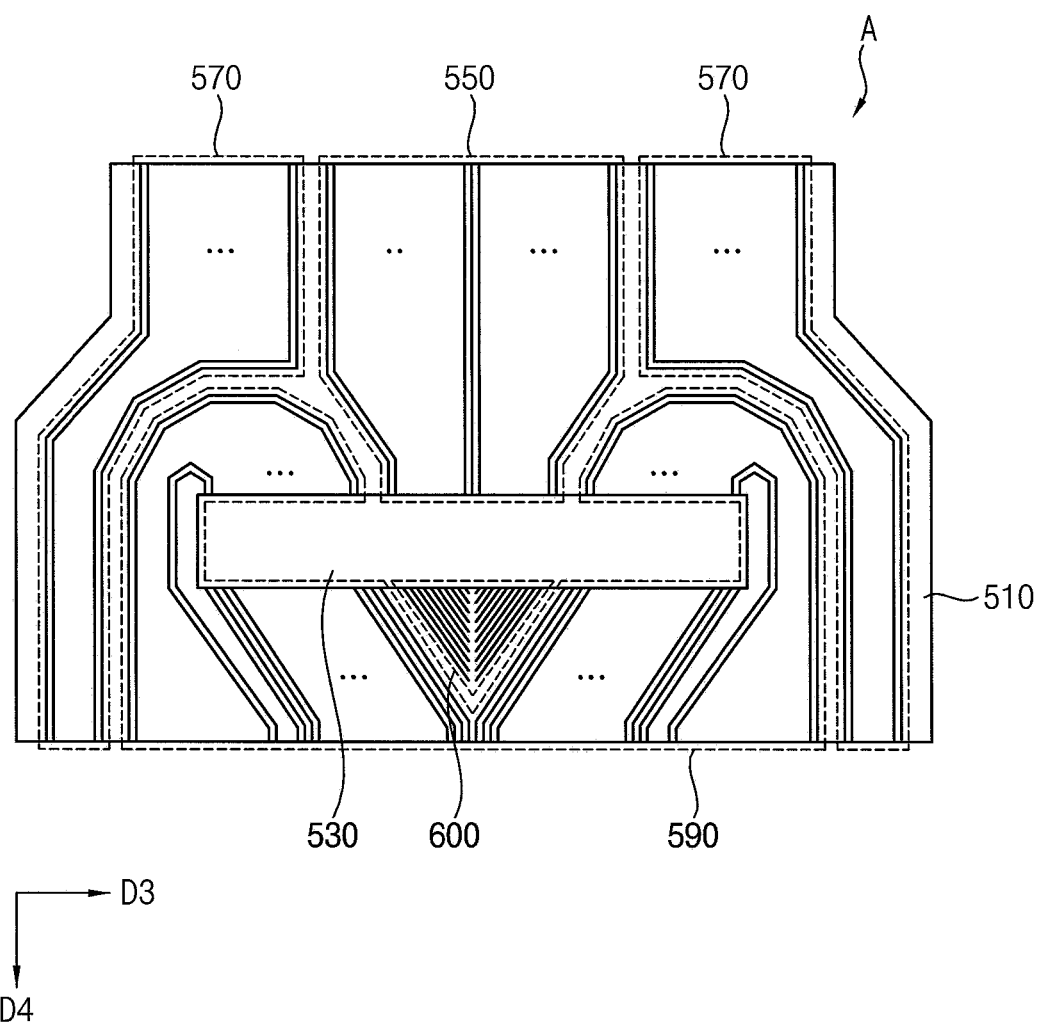
FIG. 6 is an enlarged top plan view corresponding to region 'A' of the chip on film package of FIG. 1.

FIG. 1 is a top plan view illustrating an exemplary embodiment of a chip on film package in accordance with the invention, and FIG. 2 is an enlarged top plan view for describing regions within the region 'A' of the chip on film package of FIG. 1. FIG. 3 is a top plan view for describing first and second portions of a first region included in the chip on film package of FIG. 2, and FIG. 4 is a top plan view of an exemplary embodiment of a driving integrated circuit ("IC") chip included in the chip on film package of FIG. 1. FIG. 5A is an enlarged top plan view illustrating an exemplary embodiment of an electrical ground pattern structure included in the chip on film package of FIG. 1, and FIG. 5B is an enlarged top plan view illustrating a modified exemplary embodiment of an electrical ground pattern structure included in the chip on film package of FIG. 1. FIG. 6 is an enlarged top plan view corresponding to region 'A' of the chip on film package of FIG. 1. Regions 10, 20, 30, 40 and 50 described above are indicated by dotted lines in FIG. 6.

Referring to FIGS. 1, 2, 3, 4, 5A, and 6, a chip on film package 500 may include a base substrate 510, a driving integrated circuit ("IC") chip 530, an electrical ground pattern structure 600, a first pad electrode 470, a second pad electrode 475, an input (conductive) wiring provided in plural within first input wirings 550, an input (conductive) wiring provided in plurality within second input wirings 570, an output (conductive) wiring provided in plurality within output wirings 590, etc. The first and second pad electrodes 470 and 475 may be provided in plurality within the chip on film package 500.

As illustrated in FIG. 1, the first pad electrodes 470 and the second pad electrodes 475 may be respectively disposed at opposing lateral portions of the base substrate 510.

In an exemplary embodiment, for example, the first pad electrodes 470 may be connected to (or be coupled to) a display panel capable of displaying an image such as with light, and the second pad electrodes 475 may be connected to an external device capable of generating a plurality of signals provided to the display panel to control or drive the display panel to display the image. The external device may generate electronic data signals, scan signals, light emission signals, power supply voltages, touch sensing signals, etc., and may provide the data signals, the scan signals, the light emission signals, the power supply voltages, the touch sensing signals, etc. to the display panel through the chip on film package 500.

Referring again to FIGS. 2, 4, and 6, the base substrate 510 may have a first region 10, a second region 20, a third region 30, a fourth region 40, and a driving IC region 50. In an exemplary embodiment, for example, the driving IC region 50 may be located in a center of the base substrate 510.

The driving IC chip 530 may be disposed in the driving IC region 50, on the base substrate 510. As illustrated in FIG. 4, the driving IC chip 530 may have a first side portion 531, a second side portion 532, a third side portion 533, and a fourth side portion 534. The first side portion 531 may lengthwise extend in a third direction D3 that is parallel to an upper surface of the base substrate 510, and the second side portion 532 may face the first side portion 531. In addition, the third side portion 533 may lengthwise extend in a fourth direction D4 that crosses the third direction D3 such as being perpendicular to the third direction D3, and the fourth side portion 534 may face the third side portion 533. In an exemplary embodiment, for example, each of the lengths of the first and second side portions 531 and 532 of the driving IC chip 530 may be greater than each of lengths of the third and fourth side portions 533 and 534 of the driving IC chip 530. Input signals and driving IC power supply voltages from the external device may be provided to (e.g., input to) the driving IC chip 530, and the driving IC chip 530 may provide output signals to the display panel based on the input signals. Accordingly, the driving IC chip 530 may control a driving of the display panel such as to display an image.

Referring again to FIGS. 2, 3, 5A, and 6, the first region 10 may be located at a first side (e.g., corresponding to the first side portion 531 of the driving IC chip 530) of the driving IC region 50, on the base substrate 510. As illustrated in FIG. 3, a left side of the first region 10 may be defined as a first portion 11, a right side of the first region 10 may be defined as a second portion 12. The first portion 11 may be located adjacent to the second portion 12. In exemplary embodiments, the first region 10 may have a plan shape of an inverted triangle.

The ground pattern structure 600 may be disposed in the first region 10, on the base substrate 510. The ground pattern structure 600 may be in contact with the first side portion 531 of the driving IC chip 530. In an exemplary embodiment, for example, the ground pattern structure 600 may be disposed so as to electrically ground the driving IC chip 530.

The ground pattern structure 600 may include a ground pattern provided in plurality on the base substrate 510. Ends of the ground patterns at a first side of the ground patterns may each be aligned with a line parallel to the first side portion 531 of the driving IC chip 530. In exemplary embodiments, the ground patterns may have i) a first diagonal shape disposed in the first portion 11 of the first region 10 and each lengthwise extending in a first direction D1 and ii) a second diagonal shape disposed in the second portion 12 of the first region 10 and each lengthwise extending in a second direction D2 that is different from the first direction D1. In addition, the ground patterns disposed inclined by having the first diagonal shape and lengthwise extending in the first direction D1 may be spaced apart from each other by aligning the ends of the ground patterns with the first side of the driving IC chip 530, and may have different lengths from each other. The ground patterns disposed inclined by having the second diagonal shape and lengthwise extending in the second direction D2 may be spaced apart from each other by aligning the ends of the ground patterns with the first side of the driving IC chip 530, and have different lengths from each other. Further, the ground patterns having first diagonal shape and each lengthwise extending in the first direction D1 and the ground patterns having second diagonal shape and each lengthwise extending in the second direction D2 may be symmetric to each other relative to a boundary between the first and second portions 11 and 12 of the first region 10, by aligning each end of the ground patterns with the first side of the driving IC chip 530.

In an exemplary embodiment, for example, the ground patterns having the first diagonal shape and each lengthwise extending in the first direction D1 and the ground patterns having second diagonal shape and each lengthwise extending in the second direction D2 may be symmetric to each other with respect to a virtual line in the fourth direction D4 extending from the center of the driving IC chip 530. In addition, the ground patterns having first diagonal shape and each lengthwise extending in the first direction D1 and the ground patterns having second diagonal shape and each lengthwise extending in the second direction D2 may be spaced apart from each other with respect to the virtual line in the fourth direction D4 extending from the center of the driving IC chip 530.

In exemplary embodiments, when the chip on film package 500 is bent or twisted in connecting the display panel to an external device, a stress may be converged in the first region 10. As the ground pattern structure 600 has the first and second diagonal shapes, the stress may be relatively reduced in the first region 10. Accordingly, conductive wirings included in the chip on film package 500 may not be damaged such as being separated or cut. As compared to a conventional ground pattern structure having a plan shape of a bar (or a shape of a straight line), one or more exemplary embodiment in accordance with the invention may reduce the stress from bending or twisting of the chip on film package by about 10% when the ground pattern structure 600 has ground patterns each inclined with respect to the first side of the driving IC chip 530 to have the first and second diagonal shapes described above.

In exemplary embodiments, as illustrated in FIG. 5A, the plurality of ground patterns may include first through twentieth ground patterns 601, 602, 603, 604, 605, 606, 607, 608, 609, 610, 611, 612, 613, 614, 615, 616, 617, 618, 619, and 620. The first, third, fifth, seventh, ninth, eleventh, thirteenth, fifteenth, seventeenth and nineteenth ground patterns 601, 603, 605, 606, 607, 609, 611, 613, 615, 617, and 619, which are odd-numbered ground patterns, among the plurality of ground patterns may each be inclined along the first direction D1 to have the first diagonal shape extending in the first direction D1, and may each be disposed in the first portion 11 of the first region 10. Here, lengths of the first, third, fifth, seventh, ninth, eleventh, thirteenth, fifteenth, seventeenth and nineteenth ground patterns 601, 603, 605, 606, 607, 609, 611, 613, 615, 617, and 619 may be sequentially reduced in a direction toward a center of the first region 10 along the first side of the driving IC chip 530. The odd-numbered ground patterns may be defined as first group of ground patterns 710.

In addition, the second, fourth, sixth, eighth, tenth, twelfth, fourteenth, sixteenth, eighteenth and twentieth ground patterns 602, 604, 606, 608, 610, 612, 614, 616, 618, 620, which are even-numbered ground patterns, among the plurality of ground patterns may each be inclined along the second direction D2 to have the second diagonal shape extending in the second direction D2, and may each be disposed in the second portion 12 of the first region 10. Here, lengths of the second, fourth, sixth, eighth, tenth, twelfth, fourteenth, sixteenth, eighteenth and twentieth ground patterns 602, 604, 606, 608, 610, 612, 614, 616, 618, 620 may be sequentially reduced in a direction toward a center of the first region 10 along the first side of the driving IC chip 530. The even-numbered ground patterns may be defined as second group of ground patterns 720.

A first distal end of each of the first group of ground patterns 710 and a first distal end of each of the second group of ground patterns 720 may be adjacent to each other. A second distal end of each of the first group of ground patterns 710 and a second distal end of each of the second group of ground patterns 720 may be aligned with a line parallel to the first side portion 531 of the driving IC chip 530. Here, the first distal end of each of the first group of ground patterns 710 and the second group of ground patterns 720 may be opposite to the second distal end of each of the first group of ground patterns 710 and the second group of ground patterns 720, respectively.

In exemplary embodiments, the overall ground pattern structure 600 has twenty ground patterns, but not being limited thereto.

In an exemplary embodiment, for example, the plurality of ground patterns within an overall ground pattern structure 600 may include first through (M)th ground patterns, and (K)th and (K+1)th ground patterns among the first through (M)th ground patterns may be symmetric to each other such as relative to a center of the first region 10 in which the ground pattern structure 600 is disposed. Here, M may be integer greater than 1, and K may be integer between 1 and M. In addition, the (K)th ground pattern may each be inclined to have the first diagonal shape, and the (K+1)th ground pattern may each be inclined to have the second diagonal shape. A first group of the (K)th and (K+1)th ground patterns may form a V shape with a second group of the (K)th and (K+1)th ground patterns symmetrical to the first group. Further, corresponding ground patterns within the groups of (K)th and (K+1)th ground patterns may have a same length as each other along the inclined direction.

First distal ends of each of the (K)th and (K+1)th ground patterns may be adjacent to each other, and second distal ends of each of the (K)th and (K+1)th ground patterns may be aligned with a line parallel to the first side of the driving IC chip. Here, the first distal end may be opposite to the second distal end for each of the ground patterns.

A (2M−1)th ground pattern among the first through (M)th ground patterns may be disposed as a first group in the first portion 11 of the first region 10, and a (2M)th ground pattern among the first through (M)th ground patterns may be disposed as a second group in the second portion 12 of the first region 10. In addition, lengths of the (2M−1)th and (2M)th ground patterns may be sequentially reduced in a direction toward a center of the first region 10 along the first side of the driving IC chip 530.

In addition, the first region 10 has an overall plan shape of an inverted triangle, but not being limited thereto. In some exemplary embodiments, the first region 10 may have a plan shape of a tetragon, a plan shape of a pentagon, etc. In an exemplary embodiment, for example, when the first region 10 has the plan shape of the pentagon, a ground pattern structure may have a shape illustrated in FIG. 5B.

In some exemplary embodiments, the chip on film package 500 may include a diagonal pattern structure including a plurality of diagonal patterns each inclined such as with respect to a side of the driving IC chip 530, to have a first diagonal shape and a second diagonal shape, respectively, as described above. The diagonal pattern structure having substantially the same shape as the ground pattern structure 600, may be disposed in at least one among the first region 10, the second region 20, the third region 30, and the fourth region 40, on the base substrate 510. When the chip on film package 500 is bent, the diagonal pattern structure may be disposed in a region, in which a stress is converged, among the first, second, third, and fourth regions 10, 20, 30, and 40. In an exemplary embodiment, for example, when the diagonal pattern structure is disposed in the first region 10 where the stress is converged, the diagonal pattern structure may not be connected to the driving IC chip 530. In other words, the diagonal pattern structure may be spaced apart from the driving IC chip 530, and may not be electrically connected to the driving IC chip 530. Otherwise, when the diagonal pattern structure is disposed in a portion of the second region 20, a portion of the third portion 30 or a portion of the fourth region 40, the diagonal pattern structure may be spaced apart from conductive wirings within such region. In other words, the diagonal pattern structure may correspond to a dummy pattern that is not electrically connected to the wirings of the respective second, third or fourth regions 20, 30 and 40.

Referring again to FIGS. 2 and 6, the second region 20 may be located at a second side (e.g., corresponding to the second side portion 532 of the driving IC chip 530) of the driving IC region 50, on the base substrate 510.

The plurality of input wirings within the first input wirings 550 may be spaced apart from each other in the second region 20, on the base substrate 510. In an exemplary embodiment, for example, a first distal end of each of the plurality of input wirings within the first input wirings 550 may be respectively connected to the second pad electrodes 475 (refer to FIG. 1), and a second distal end of each of the plurality of input wirings within the first input wirings 550 may be connected to the driving IC chip 530 at the second side portion 532 of the driving IC chip 530. Here, the first distal ends of the first input wirings 550 may be opposite to the second distal ends of the first input wirings 550. That is, each of the input wirings within the first input wirings 550 may electrically connect the driving IC chip 530 and the external device to each other. The input wirings within the first input wirings 550 may transmit electronic signals such as data signals, scan signals, light emission signals, power supply voltages, touch sensing signals, etc., generated from the external device, to the driving IC chip 530. In an exemplary embodiment, for example, the first input wirings 550 may transmit data signals and power supply voltages of the driving IC chip 530.

The third region 30 may be provided in plurality respectively located at opposing sides of the driving IC chip 530 (e.g., corresponding to the third and fourth side portions 533 and 534 of the driving IC chip 530) of the driving IC region 50 on the base substrate 510.

The plurality of input wirings within the second input wirings 570 (e.g., bypass wirings) may be spaced apart from each other in the third regions 30, on the base substrate 510. The second input wirings 570 may not be connected to the driving IC chip 530, and may bypass the driving IC chip 530. The second input wirings 570 may not be connected to the output wirings 590, and may bypass the output wirings 590. In an exemplary embodiment, for example, a first distal end of the second input wirings 570 may be connected to the second pad electrodes 475 (refer to FIG. 1), and a second distal end of the second input wirings 570 may be connected to the first pad electrodes 470. Here, the first distal ends of the second input wirings 570 may be opposite to the second distal ends of the second input wirings 570. That is, the second input wirings 570 may electrically connect the external device and the display panel to each other. The second input wirings 570 may transmit electronic signals such as data signals, scan signals, light emission signals, power supply voltages, touch sensing signals, etc. generated from the external device to the display panel. In an exemplary embodiment, for example, the second input wirings 570 may transmit the scan signals.

The fourth region 40 may be located between the second region 20 and the third regions 30, on the base substrate 510, and may surround the first region 10.

The plurality of output wirings within the output wirings 590 may be spaced apart from each other in the fourth region 40, on the base substrate 510. In an exemplary embodiment, for example, a first distal end of the output wirings 590 may be connected to the driving IC chip 530 at the first, second, third, and/or fourth side portions 531, 532, 533, and/or 534 of the driving IC chip 530, and a second distal end of the output wirings 590 may be connected to the first pad electrodes 470. Here, the first distal ends of the output wirings 590 may be opposite to the second distal ends of the output wirings 590. That is, the output wirings 590 may electrically connect the driving IC chip 530 and the display panel to each other.

In other words, the first input wirings 550 may be in contact with a portion of the second side portion 532 of the driving IC chip 530. The ground pattern structure 600 (e.g., the ground patterns) may be spaced apart from or in contact with a portion of the first side portion 531 of the driving IC chip 530. The output wirings 590 may be respectively in contact with a remaining portion of the first side portion 531 of the driving IC chip 530 with which the ground pattern structure 600 is not in contact, a remaining portion of the second side portion 532 of the driving IC chip 530 with which the first input wirings 550 are not in contact, the third side portion 533 of the driving IC chip 530, and the fourth side portion 534 of the driving IC chip 530. In an exemplary embodiment, for example, data signals of the driving IC chip 530 may be provided to the output wirings 590, and the output wirings 590 may transmit the data signals to the display panel at the first pad electrodes 470.

In exemplary embodiments, the output wirings 590 located at the remaining portion of the first side portion 531 of the driving IC chip 530 and the ground patterns may be parallel to each other at the first side portion 531. In an exemplary embodiment, for example, portions of the output wirings 590 disposed adjacent to the first portion 11 of the first region 10 may have the first diagonal shape, and may be spaced apart from inclined portions of the first ground pattern 601. Portions of the output wirings 590 disposed adjacent to the first portion 11 of the first region 10 may be parallel to inclined portions of the first group of ground patterns 710 (refer to FIGS. 5A and 5B). In addition, portions of the output wirings 590 disposed adjacent to the second portion 12 of the first region 10 may have the second diagonal shape, and may be spaced apart from inclined portions of the second ground pattern 602. The portions of the output wirings 590 disposed adjacent to the second portion 12 of the first region 10 may be parallel to the second group of ground patterns 720 (refer to FIGS. 5A and 5B).

Further, portions of the output wirings 590 extended from the remaining portion of the second side portion 532 of the driving IC chip 530, from the third side portion 533 of the driving IC chip 530, and from the fourth side portion 534 of the driving IC chip 530 may have an overall semicircular shape in the top plan view among portions of the output wirings 590 connected to the first pad electrodes 470. In an exemplary embodiment, for example, portions of the output wirings 590 located adjacent to (e.g., closest to) the first input wirings 550 may have a semicircular shape with a relatively large radius, and the output wirings 590 further from the first input wirings 550 such as connected to the third and fourth side portions 533 and 534 may have a semicircular shape with a relatively small radius. That is, a radius of curvature of the output wirings 590 may decrease as a distance from the first input wirings 550 increases.

Figure 7:
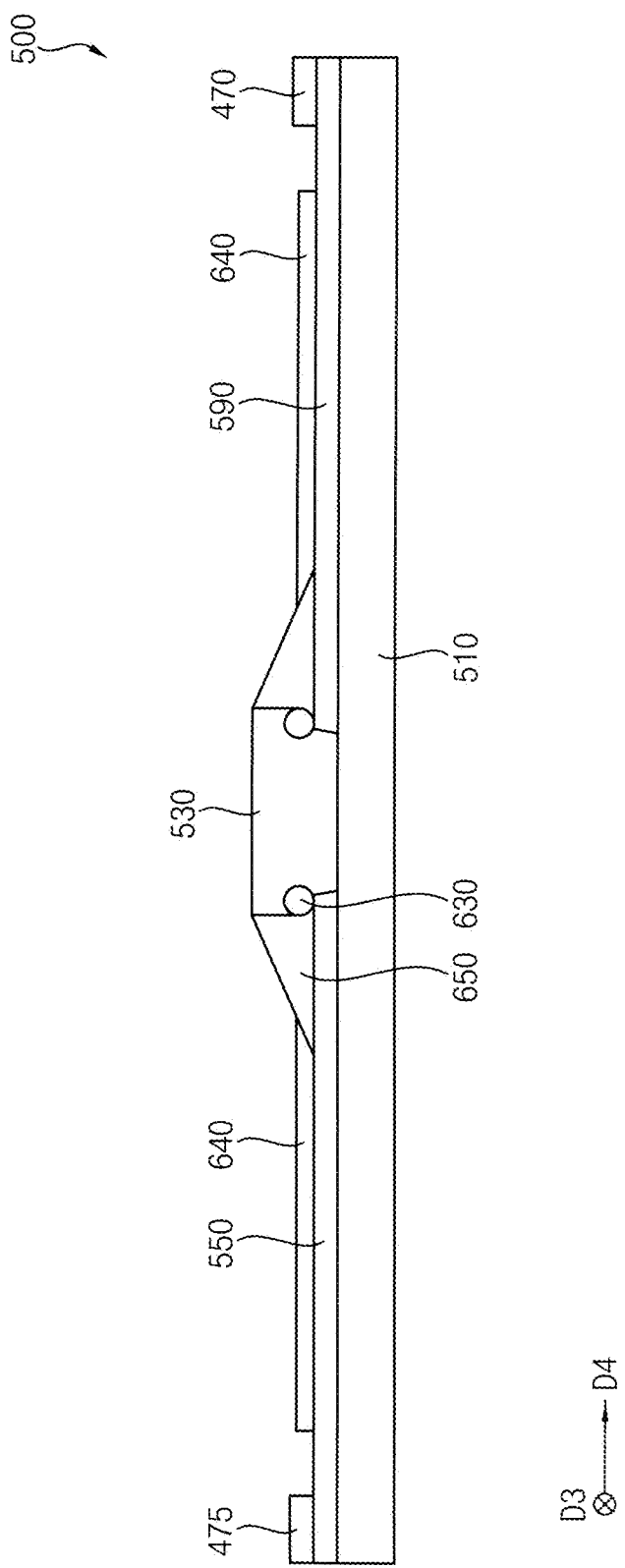
FIG. 7 is a cross-sectional view taken along line I-I' of the chip on film package of FIG. 1.

FIG. 7 is a cross-sectional view taken along line I-I' of the chip on film package of FIG. 1.

Referring to FIGS. 6 and 7, the chip on film package 500 may include the base substrate 510, the driving IC chip 530, the ground pattern structure 600 (e.g., 601 to 620), the first pad electrodes 470, the second pad electrodes 475, the first input wirings 550, the second input wirings 570, the output wirings 590, an electrode bump 630, an encapsulation pattern 650, a protection layer 640, etc. The electrode bump 630 may be provided in plurality within the chip on film package 500.

The base substrate 510 may be provided common to each of the first to fifth regions 10 to 50 described above. The base substrate 510 may include a flexible film including a relatively flexible material. In an exemplary embodiment, for example, the base substrate 510 may include a polyimide resin, a polyester region, etc. In exemplary embodiments, the base substrate 510 may have the first region 10, the second region 20, the third region 30, the fourth region 40, and the driving IC region 50. The first to fifth regions 10 to 50 may define an entirety of the base substrate 510. In an exemplary embodiment, for example, the driving IC region 50 may be located at a center of the base substrate 510, and the first region 10 may be located at a first side of the driving IC region 50. In addition, the second region 20 may be located at a second side of the driving IC region 50 opposite to the first side of the driving IC region 50, and the third regions 30 may be respectively located at opposing sides of the driving IC region 50. The fourth region 40 may be located between the second region 20 and each of the third regions 30, respectively, as well as between the first region 10 and each of the third regions 30, respectively, so as to essentially surround the first region 10 together with the fifth region 50.

The driving IC chip 530 may be disposed in the driving IC region 50, on the base substrate 510. Input signals and driving IC power supply voltages from the external device may be provided to the driving IC chip 530, and the driving IC chip 530 may provide output signals to the display panel based on the input signals. Accordingly, the driving IC chip 530 may control a driving of the display panel such as to display an image. The driving IC chip 530 may have the first side portion 531, the second side portion 532, the third side portion 533, and the fourth side portion 534 (refer to FIG. 4).

The ground pattern structure 600 may be disposed in the first region 10, on the base substrate 510. In an exemplary embodiment, for example, the ground pattern structure 600 may be disposed so as to electrically ground the driving IC chip 530. The ground pattern structure 600 may include a plurality of ground patterns, and a first side of the ground patterns may be aligned with a line parallel to the first side portion 531 of the driving IC chip 530. In exemplary embodiments, the ground patterns may have i) a first diagonal shape disposed in the first portion 11 of the first region 10 and each lengthwise extending in a first direction D1 and ii) a second diagonal shape disposed in the second portion 12 of the first region 10 and each lengthwise extending in a second direction D2 that is different from the first direction D1.

The ground pattern structure 600 may include a metal material, an alloy of a metal material, metal nitride, conductive metal oxide, transparent conductive materials, etc. In an exemplary embodiment, for example, the ground pattern structure 600 may include gold (Au), silver (Ag), aluminum (Al), platinum (Pt), nickel (Ni), titanium (Ti), palladium (Pd), magnesium (Mg), calcium (Ca), lithium (Li), chrome (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide ("ITO"), stannum oxide (SnOx), indium oxide (InOx), gallium oxide (GaOx), indium zinc oxide ("IZO"), etc. These materials may be used alone or in a suitable combination thereof. In some exemplary embodiments, the ground pattern structure 600 may have a multi-layered structure along a thickness direction of the chip on film package 500.

The first input wirings 550 may be disposed in the second region 20, on the base substrate 510, and be spaced apart from each other. In an exemplary embodiment, for example, a first distal end of the first input wirings 550 may be connected to the second pad electrodes 475, respectively, and a second distal end of the first input wirings 550 may be connected to the second side portion 532 of the driving IC chip 530. Here, the first distal ends of the first input wirings 550 may be opposite to the second distal ends of the first input wirings 550.

In an exemplary embodiment, for example, the electrode bump 630 may be disposed between the driving IC chip 530 and the first input wirings 550, respectively, and the first input wirings 550 and the driving IC chip 530 may be electrically connected to each other through the electrode bump 630. The electrode bump 630 may include a metal material, an alloy of a metal material, metal nitride, conductive metal oxide, transparent conductive materials, etc. Accordingly, the first input wirings 550 may electrically connect the driving IC chip 530 and the external device to each other. In an exemplary embodiment, for example, the first input wirings 550 may transmit data signals and power supply voltages of the driving IC chip 530. The first input wirings 550 may include a metal material, an alloy of a metal material, metal nitride, conductive metal oxide, transparent conductive materials, etc. These materials may be used alone or in a suitable combination thereof. In some exemplary embodiments, the first input wirings 550 may have a multi-layered structure along a thickness direction of the chip on film package 500.

The second input wirings 570 may be disposed in the third regions 30, on the base substrate 510, and be spaced apart from each other. The second input wirings 570 may not be connected to the driving IC chip 530, and may bypass the driving IC chip 530. In an exemplary embodiment, for example, a first distal end of the second input wirings 570 may be directly connected to the second pad electrodes 475, and a second distal end of the second input wirings 570 may be directly connected to the first pad electrodes 470. Here, the first distal ends of the second input wirings 570 may be opposite to the second distal ends of the second input wirings 570. That is, the second input wirings 570 may electrically connect the external device and the display panel to each other. In an exemplary embodiment, for example, the second input wirings 570 may transmit the scan signals. The second input wirings 570 may include a metal material, an alloy of a metal material, metal nitride, conductive metal oxide, transparent conductive materials, etc. These materials may be used alone or in a suitable combination thereof. In some exemplary embodiments, the second input wirings 570 may have a multi-layered structure along a thickness direction of the chip on film package 500.

The output wirings 590 may be disposed in the fourth region 40, on the base substrate 510, and be spaced apart from each other. In an exemplary embodiment, for example, a first distal end of the output wirings 590 may be connected to the first, second, third, and/or fourth side portions 531, 532, 533, and/or 534 of the driving IC chip 530, and a second distal end of the output wirings 590 may be connected to the first pad electrodes 470. Here, the first distal ends of the output wirings 590 may be opposite to the second distal ends of the output wirings 590.

In an exemplary embodiment, for example, the electrode bump 630 may be disposed between the driving IC chip 530 and one or more of the output wirings 590, and the output wirings 590 and the driving IC chip 530 may be electrically connected to each other through the electrode bump 630. The electrode bump 630 may include a metal material, an alloy of a metal material, metal nitride, conductive metal oxide, transparent conductive materials, etc. Accordingly, the output wirings 590 may electrically connect the driving IC chip 530 and the display panel to each other. In an exemplary embodiment, for example, the data signals form the driving IC chip 530 may be provided to the output wirings 590, and the output wirings 590 may transmit the data signals to the display panel. The output wirings 590 may include a metal material, an alloy of a metal material, metal nitride, conductive metal oxide, transparent conductive materials, etc. These materials may be used alone or in a suitable combination thereof. In some exemplary embodiments, the output wirings 590 may have a multi-layered structure along a thickness direction of the chip on film package 500.

In exemplary embodiments, the ground pattern structure 600, the first input wirings 550, the second input wirings 570, and the output wirings 590 may include the same materials as each other, and may be simultaneously (or concurrently) formed. In an exemplary embodiment of a method of manufacturing a chip on film package, for example, after preliminary electrode material layer is formed on the entire base substrate 510, the ground pattern structure 600, the first input wirings 550, the second input wirings 570, and the output wirings 590 may be simultaneously formed on the base substrate 510 such as by selectively etching the preliminary electrode material layer. That is, the ground pattern structure 600, the first input wirings 550, the second input wirings 570, and the output wirings 590 as being formed from a same material layer may be located in a same single layer among layers formed on the base substrate 510.

The encapsulation pattern 650 may be disposed on portions of the first input wirings 550 and the output wirings 590 which are adjacent to (e.g., closest to) the driving IC chip 530. The encapsulation pattern 650 may surround a side portion of the driving IC chip 530 in the top plan view, and may cover the electrode bump 630. The encapsulation pattern 650 may include a material having a relatively high thermal conductivity to release a heat generated from the IC chip 530. In an exemplary embodiment, for example, the encapsulation pattern 650 may include epoxy resin or silicon resin.

The protection layer 610 may be disposed on the first input wirings 550, the second input wirings 570, and the output wirings 590. A same single protection layer 610 may extend to be commonly disposed on the first input wirings 550, the second input wirings 570, and the output wirings 590. The protection layer 610 may protect portions the first input wirings 550, the second input wirings 570, the ground pattern structure 600, and the output wirings 590 such as from outside impact, contaminants, etc. The protection layer 610 may include solder resist.

The first pad electrodes 470 and the second pad electrodes 475 may be disposed at opposing ends of the chip on film package 500, on the base substrate 510. The first pad electrodes 470 may be disposed on the output wirings 590, and the second pad electrodes 475 may be disposed on the first input wirings 550. In an exemplary embodiment, for example, the first pad electrodes 470 may be connected to the display panel capable of displaying an image with electronic signals provided to the display panel, and the second pad electrodes 475 may be connected to the external device capable of generating a plurality of signals which are provided to the display panel via the chip on film package 500.

Each of the first pad electrodes 470 and the second pad electrodes 475 may include a metal material, an alloy of a metal material, metal nitride, conductive metal oxide, transparent conductive materials, etc. These materials may be used alone or in a suitable combination thereof. In some exemplary embodiments, each of the first pad electrodes 470 and the second pad electrodes 475 may have a multi-layered structure along a thickness direction of the chip on film package 500.

In the chip on film package 500 in accordance with one or more exemplary embodiments, when the chip on film package 500 is bent or twisted, a stress may be converged in the first region 10. As the ground pattern structure 600 has ground patterns inclined to form the first and second diagonal shapes, the stress may be relatively reduced in the first region 10. Accordingly, conductive wirings included in the chip on film package 500 may not be damaged such as being separated or cut.

Figure 8:
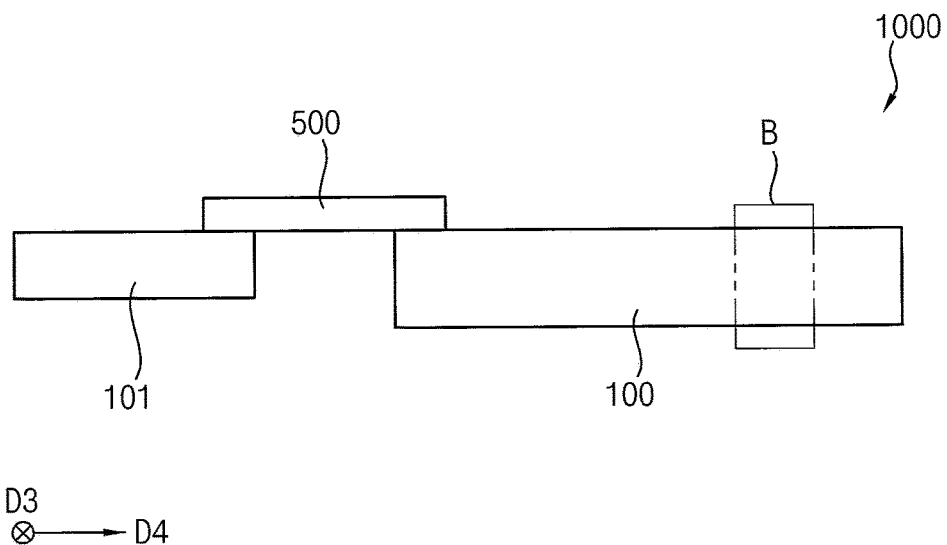
FIG. 8 is a cross-sectional view illustrating an exemplary embodiment of a display device in accordance with the invention.
Figure 9:
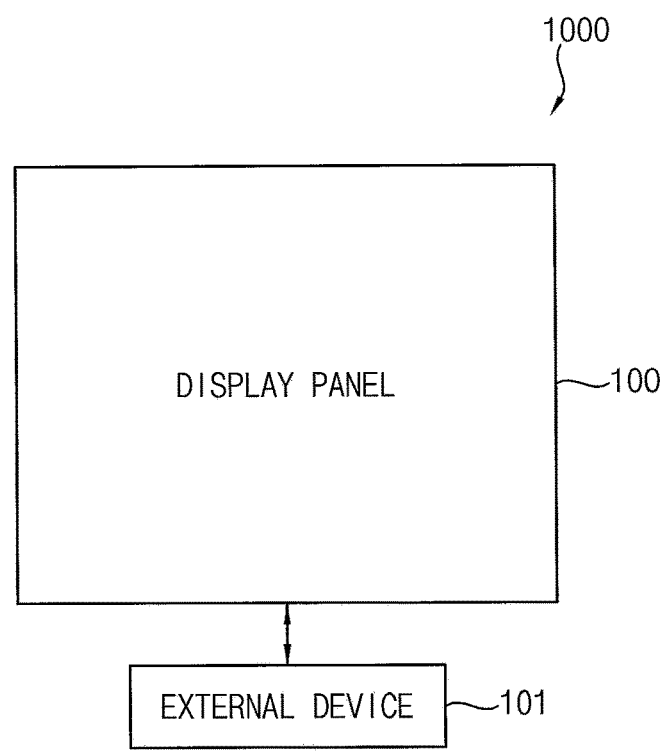
FIG. 9 is a block diagram for describing an exemplary embodiment of an external device electrically connected to a display panel included in the display device of FIG. 8.
Figure 10:
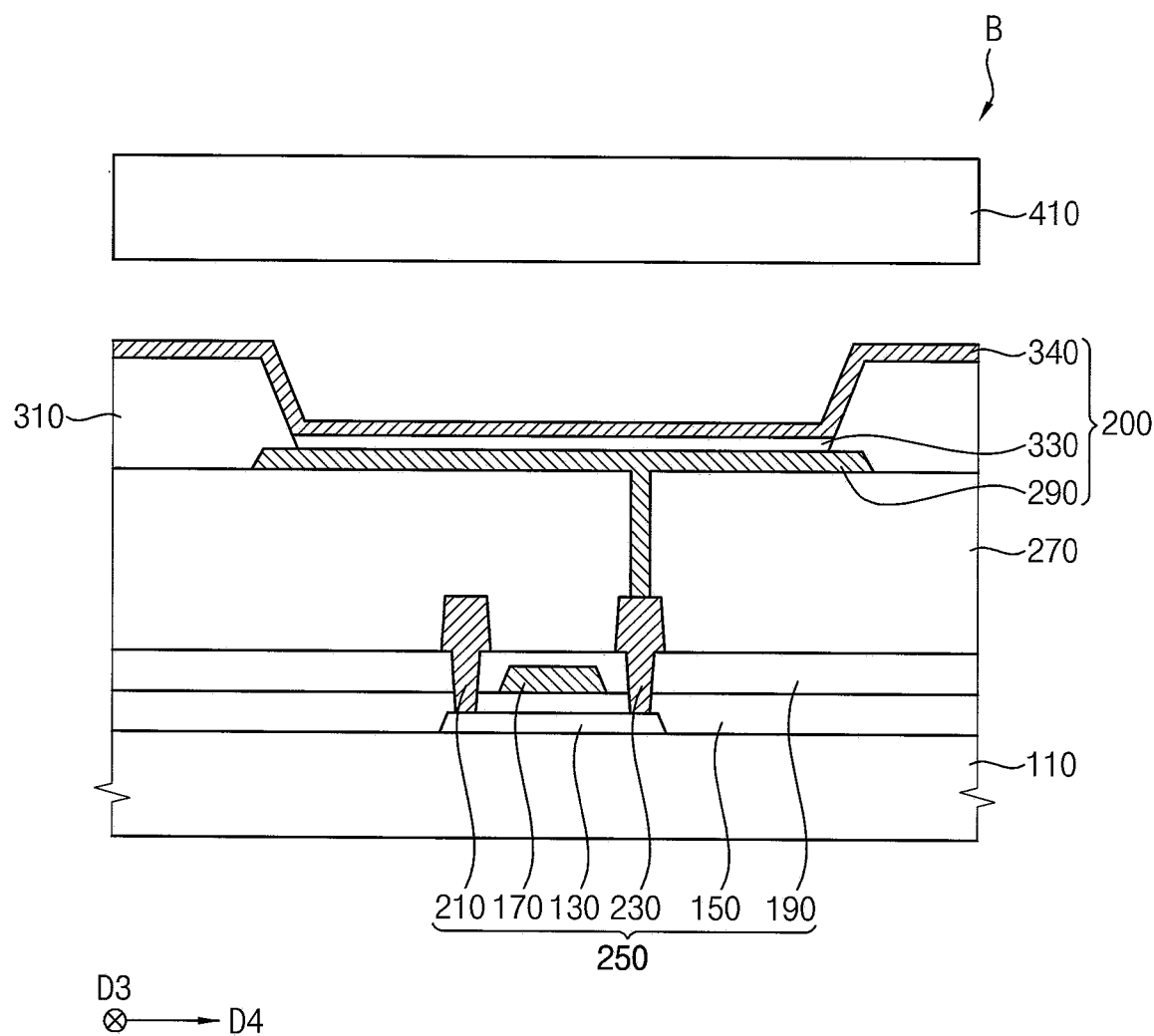
FIG. 10 is an enlarged cross-sectional view corresponding to region 'B' of FIG. 8.
Figure 11:
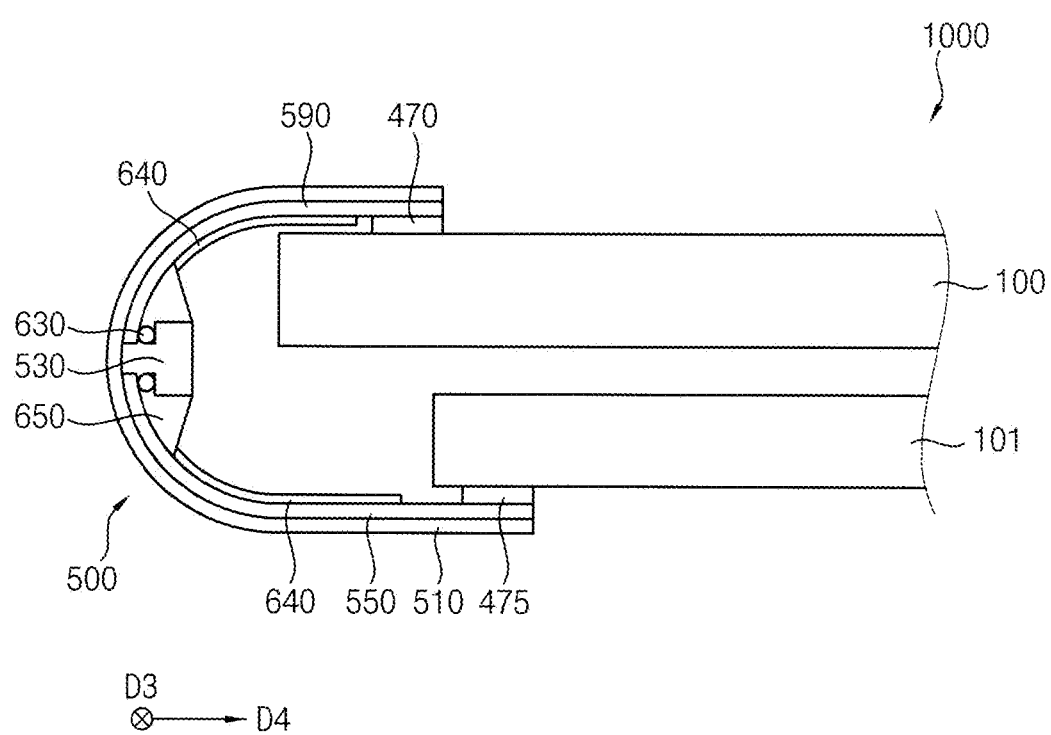
FIG. 11 is a cross-sectional view for describing an exemplary embodiment of a bent shape of a chip on film package included in the display device of FIG. 8.
Figure 12:
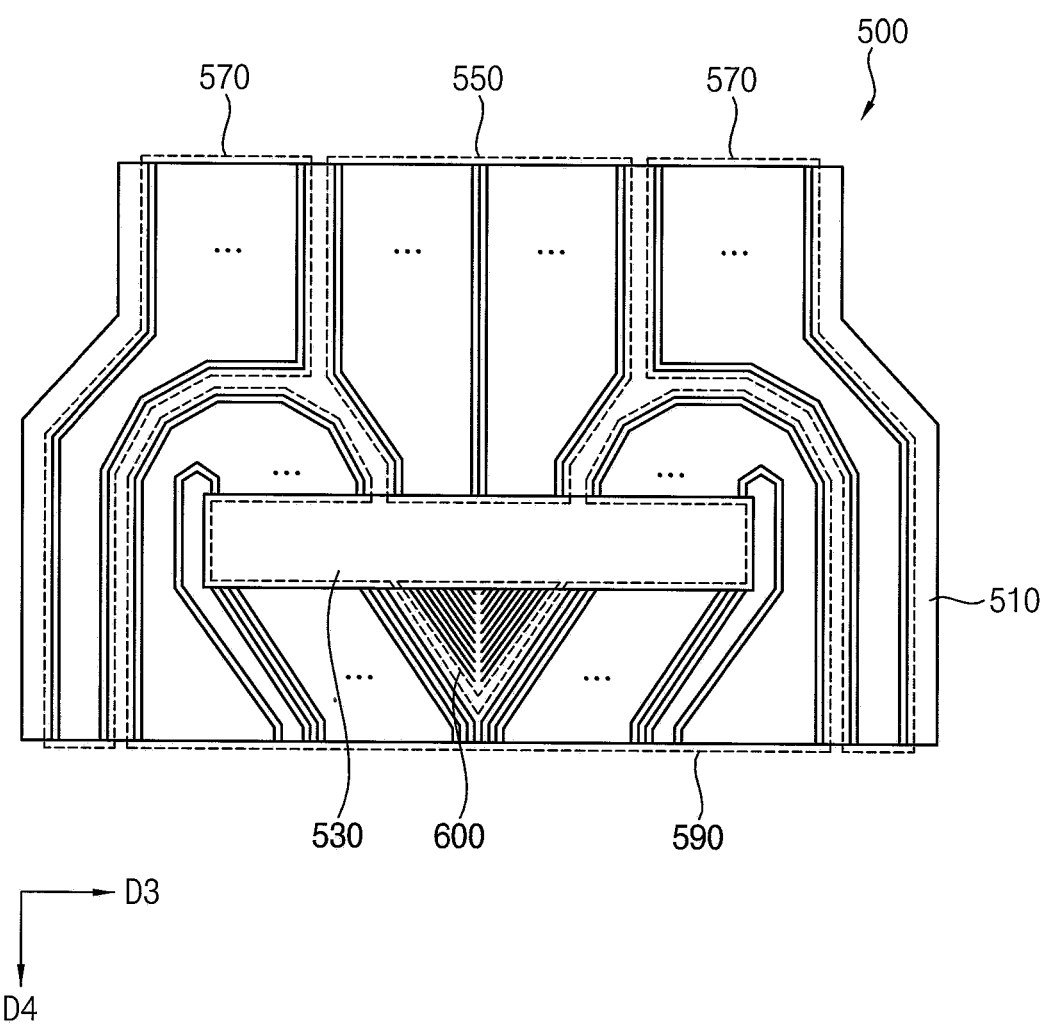
FIG. 12 is an enlarged top plan view illustrating an exemplary embodiment of a chip on film package included in the display device of FIG. 8.

FIG. 8 is a cross-sectional view illustrating an exemplary embodiment of a display device in accordance with the invention, and FIG. 9 is a block diagram for describing an exemplary embodiment of an external device electrically connected to a display panel included in the display device of FIG. 8. FIG. 10 is an enlarged plan view corresponding to region 'B' of FIG. 8, and FIG. 11 is a cross-sectional view for describing an exemplary embodiment of a bent shape of a chip on film package included in the display device of FIG. 8. FIG. 12 is an enlarged top plan view illustrating a chip on film package included in the display device of FIG. 8.

A display device 1000 illustrated in FIGS. 8, 9, 10, 11, and 12 may have a configuration including an chip on film package 500 described with reference to one or more exemplary embodiments in FIGS. 1 through 7. In FIGS. 8, 9, 10, 11, and 12, detailed descriptions for elements that are substantially the same as or similar to elements described with reference to FIGS. 1 through 7 may not be repeated. Regions 10, 20, 30, 40 and 50 described above are indicated by dotted lines in FIG. 12.

Referring to FIGS. 8, 9, 10, 11, and 12, the display device 1000 may include a display panel 100, the chip on film package 500, and an external device 101. Here, the display panel 100 may include a (base) substrate 110, a semiconductor element 250, a planarization layer 270, a pixel defining layer 310, a pixel structure 200, and an encapsulation substrate 410. In addition, the semiconductor element 250 may include an active layer 130, a gate insulation layer 150, a gate electrode 170, an insulating interlayer 190, a source electrode 210, and a drain electrode 230, and the pixel structure 200 may include a lower electrode 290, a light emitting layer 330, and an upper electrode 340. Further, the chip on film package 500 may include a base substrate 510, a driving IC chip 530, a ground pattern structure 600, first pad electrodes 470, second pad electrodes 475, first input wirings 550, second input wirings 570, output wirings 590, an electrode bump 630, an encapsulation pattern 650, a protection layer 640, etc.

The display panel 100 may display an image, and the chip on film package 500 may be connected to the display panel 100 at a first side of the display panel 100. A first end of the chip on film package 500 may be connected to the display panel 100, and a second end of the chip on film package 500 opposite to the first end thereof may be connected to the external device 101. As illustrated in FIG. 9, the external device 101 may generate electronic control and/or power signals such as data signals, scan signals, light emission signals, power supply voltages, touch sensing signals, etc., and may provide the data signals, the scan signals, the light emission signals, the power supply voltages, the touch sensing signals, etc. to the display panel 100 through the chip on film package 500.

The display device 1000 may be any of a number of flat panel displays which display an image such as with light. The flat panel display may display the image with light generated external to the display panel which is provided to the display panel such as a liquid crystal display ("LCD") device and with light generated and emitted internally within the display panel such as an organic light emitting display ("OLED") device. As illustrated in FIG. 10, the display panel 100 as an OLED device is described as an example and may be configured as follows.

The (base) substrate 110 may be provided. The substrate 110 may include a transparent or opaque material. The substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a relatively flexible transparent material such as a flexible transparent resin substrate (e.g., a polyimide substrate). In an exemplary embodiment, for example, the polyimide substrate may include a first polyimide layer, a first barrier film layer, a second polyimide layer, a second barrier film layer, etc. arranged along a thickness direction of the substrate 110 Since the polyimide substrate is relatively thin and flexible, in an exemplary embodiment of a method of manufacturing the display panel 100, the polyimide substrate may be formed on a rigid glass substrate to help support the formation of the semiconductor element 250 and the pixel structure 200 on the polyimide substrate. That is, the substrate 110 may have a structure in which the first polyimide layer, the first barrier film layer, the second polyimide layer, the second barrier film layer are stacked on the rigid glass substrate.

In an exemplary embodiment of manufacturing the OLED device, after an insulating layer (e.g., a buffer layer) is provided on the second polyimide layer of the polyimide substrate, the semiconductor element 250 and the pixel structure 200 may be formed on the buffer layer. After the semiconductor element 250 and the pixel structure 200 are formed on the buffer layer, the rigid glass substrate on which the polyimide substrate is formed may be removed. It may be difficult to directly form the semiconductor element 250 and the pixel structure 200 on the polyimide substrate because the polyimide substrate is relatively thin and flexible. Accordingly, the semiconductor element 250 and the pixel structure 200 are formed on the polyimide substrate supported on the rigid glass substrate, and then the polyimide substrate may serve as the substrate 110 after the removal of the rigid glass substrate.

A buffer layer (not shown) may be disposed on the substrate 110. The buffer layer may be disposed on the entire substrate 110. The buffer layer may be between the substrate 110 and the gate insulation layer 150. The buffer layer may reduce or effectively prevent the diffusion of metal atoms and/or impurities from the substrate 110 into components of the OLED device. In addition, the buffer layer may control a rate of a heat transfer in a crystallization process for forming the active layer 130 in a method of manufacturing the display panel 100, thereby obtaining substantially uniform the active layer 130. Further, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. In an exemplary embodiment, for example, the buffer layer may include silicon material, metal oxide, etc.

The active layer 130 may be disposed on the substrate 110. In an exemplary embodiment, for example, the active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may be disposed on the substrate 110. In an exemplary embodiment, for example, the gate insulation layer 150 may sufficiently cover the active layer 130 on the substrate 110, and may have a substantially level surface without a step around the active layer 130. Alternatively, the gate insulation layer 150 may cover the active layer 130 on the substrate 110, and may be disposed as a substantially uniform thickness along a profile of the active layer 130 such that a step is formed at the active layer 130. The gate insulation layer 150 may include silicon material, a metal oxide, etc. In an exemplary embodiment, for example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 at which the active layer 130 is located. The gate electrode 170 may include a metal material, a metal material alloy, metal nitride, conductive metal oxide, transparent conductive materials, etc. In an exemplary embodiment, for example, the gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These materials may be used alone or in a suitable combination thereof. In some exemplary embodiments, the gate electrode 170 may have a multi-layered structure along a thickness direction of the display panel 100.

The insulating interlayer 190 may be disposed on the gate electrode 170. The insulating interlayer 190 may cover the gate electrode 170, and may be disposed on the gate insulation layer 150. In an exemplary embodiment, for example, the insulating interlayer 190 may sufficiently cover the gate electrode 170 on the gate insulation layer 150, and may have a substantially level surface without a step around the gate electrode 170. Alternatively, the insulating interlayer 190 may cover the gate electrode 170 on the gate insulation layer 150, and may be disposed as a substantially uniform thickness along a profile of the gate electrode 170 such that a step is formed at the gate electrode 170. The insulating interlayer 190 may include silicon material, metal oxide, etc.

The source electrode 210 and the drain electrode 230 may be disposed on the insulating interlayer 190 to be separated from each other. The source electrode 210 may be in direct contact with a first side (e.g., a source region) of the active layer 130 via a contact hole formed by removing a portion of the gate insulation layer 150 and the insulating interlayer 190 each. The drain electrode 230 may be in direct contact with a second side (e.g., a drain region) of the active layer 130 via a contact hole formed by removing another portion of the gate insulation layer 150 and the insulating interlayer 190. The source electrode 210 and the drain electrode 230 may include a metal material, an alloy, metal nitride, conductive metal oxide, transparent conductive materials, etc. These may be used alone or in a suitable combination thereof. In some exemplary embodiments, each of the source and drain electrodes 210 and 230 may have a multi-layered structure along a thickness direction of the display panel 100.

Accordingly, the semiconductor element 250 including the active layer 130, the gate insulation layer 150, the gate electrode 170, the insulating interlayer 190, the source electrode 210, and the drain electrode 230 may be disposed. The semiconductor element 250 may be a switching element with which a pixel or light-emission region of the display device 1000 is controlled to generate and/or emit light for displaying an image.

In exemplary embodiments, the semiconductor element 250 has a top gate structure, but not being limited thereto. In an exemplary embodiment, for example, in some exemplary embodiments, the semiconductor element 250 may have a bottom gate structure.

The planarization layer 270 may be disposed on the source electrode 210 and the drain electrode 230. The planarization layer 270 may cover the source electrode 210 and the drain electrode 230. That is, the planarization layer 270 may be disposed on the entire insulating interlayer 190. In exemplary embodiments, the planarization layer 270 may be disposed at a relatively large thickness to sufficiently cover each of the source and drain electrodes 210 and 230. In this case, the planarization layer 270 may have a substantially flat upper surface, and a planarization process may be further performed on a planarization material layer to implement the flat upper surface of the planarization layer 270. Alternatively, the planarization layer 270 may cover the source and drain electrodes 210 and 230, and may be disposed as a substantially uniform thickness along a profile of the source and drain electrodes 210 and 230 such as to form a step at the source and drain electrodes 210 and 230. The planarization layer 270 may include an organic material or an inorganic material. In exemplary embodiments, the planarization layer 270 may include organic materials. In an exemplary embodiment, for example, the planarization layer 270 may include a polyimide-based resin, a photoresist, an acryl-based resin, a polyamide-based resin, a siloxane-based resin, etc.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250 so as to control the pixel structure 200 for light emission and/or image display. The lower electrode 290 may include a metal material, a metal alloy material, metal nitride, conductive metal oxide, transparent conductive materials, etc. These materials may be used alone or in a suitable combination thereof. Alternatively, the lower electrode 290 may have a multi-layered structure along a thickness direction of the display panel 100.

The pixel defining layer 310 may be disposed on the planarization layer 270, and may expose a portion the lower electrode 290. An opening of the pixel definition layer 310 may define a display area of a pixel or light emission region of a pixel. The lower electrode 290 may be exposed at a light-emission region of the OLED device. The pixel defining layer 310 may include an organic material or an inorganic material. In exemplary embodiments, the pixel defining layer 310 may include organic materials.

The light emitting layer 330 may be disposed on the lower electrode 290 exposed by the pixel defining layer 310. The light emitting layer 330 may include or be formed using at least one of light emitting materials capable of generating different colors of light (e.g., a red color of light, a blue color of light, and a green color of light) according to sub-pixels or pixels within the display panel 100. Alternatively, the light emitting layer 330 may generally generate a white color of light by stacking a plurality of light emitting materials capable of generating different colors of light such as a red color of light, a green color of light, and a blue color of light, along a thickness direction of the display panel 100. In this case, a color filter may be disposed on the light emitting layer 330. The color filter may include at least one selected from a red color filter, a green color filter, and a blue color filter. Alternatively, the color filter may include a yellow color filter, a cyan color filter, and a magenta color filter. The color filter may include a photosensitive resin.

The upper electrode 340 may be disposed on the pixel defining layer 310 and the light emitting layer 330. The upper electrode 340 may include a metal material, a metal alloy material, metal nitride, conductive metal oxide, transparent conductive materials, etc. In some exemplary embodiments, the upper electrode 340 may have a multi-layered structure along a thickness direction of the display panel 100. Accordingly, the pixel structure 200 including the lower electrode 290, the light emitting layer 330, and the upper electrode 340 may be disposed.

An encapsulation substrate 410 may be disposed on the upper electrode 340. The encapsulation substrate 410 and the substrate 110 may include substantially the same material. In an exemplary embodiment, for example, the encapsulation substrate 410 may include a quartz substrate, a synthetic quartz substrate, a calcium fluoride substrate, a fluoride-doped quartz substrate, a sodalime glass substrate, a non-alkali glass substrate, etc. In some exemplary embodiments, the encapsulation substrate 410 may include a transparent inorganic material or flexible plastic. In an exemplary embodiment, for example, the encapsulation substrate 410 may include a relatively flexible transparent resin substrate. In this case, to increase flexibility of the display device 1000, the encapsulation substrate 410 may include a stacked structure where at least one inorganic layer and at least one organic layer are alternately stacked. The stacked structure may include a first inorganic layer, an organic layer, and a second inorganic layer. In an exemplary embodiment, for example, the first inorganic layer having flexibility may be disposed along a profile of the upper electrode 340, and the organic layer having the flexibility may be disposed on the first inorganic layer. The second inorganic layer having the flexibility may be disposed on the organic layer. That is, the stacked structure may correspond to a thin film encapsulation structure that is in direct contact with the upper electrode 340.

Referring again to FIGS. 11 and 12, the ground pattern structure 600 may be disposed in the first region 10 on the base substrate 510 of the chip on film package 500. In an exemplary embodiment, for example, the ground pattern structure 600 may be disposed so as to electrically ground the driving IC chip 530. The ground pattern structure 600 may include a plurality of ground patterns, and a first side of the ground patterns may be aligned with a line parallel to the first side portion 531 of the driving IC chip 530. In exemplary embodiments, the ground patterns may have i) a first diagonal shape disposed in the first portion 11 of the first region 10 and each lengthwise extending in a first direction D1 and ii) a second diagonal shape disposed in the second portion 12 of the first region 10 and each lengthwise extending in a second direction D2 that is different from the first direction D1. The ground pattern structure 600 may include a metal material, a metal alloy material, metal nitride, conductive metal oxide, transparent conductive materials, etc. These materials are used alone or in a suitable combination thereof. In some exemplary embodiments, the ground pattern structure 600 may have a multi-layered structure along a thickness direction of the display panel 100.

The first pad electrodes 470 of the chip on film package 500 may be directly connected to a pad electrode (not shown) of the display panel 100 such as using an anisotropic conductive film ("ACF"). The pad electrode of the display panel 100 may be provided in plurality to be respectively connected to the first pad electrodes 470. In addition, the second pad electrodes 475 of the chip on film package 500 may be directly connected to a pad electrode (not shown) of the external device 101 such as using the ACF. The pad electrode of the external device 101 may be provided in plurality to be respectively connected to the second pad electrodes 475.

In an exemplary embodiment of a method of forming a display device, after the chip on film package 500 is connected to each of the display panel 100 and the external device 101, the chip on film package 500 may be bent along an end side surface of the display panel 100. When the chip on film package 500 is bent, the external device 101 may be positioned at a lower surface of the display panel 100.

The chip on film package 500 included in the display device 1000 according to one or more exemplary embodiment is bent or twisted to place the external device 101 at the lower surface of the display panel 100, a stress may be converged in the first region 10 of the chip on film package 500. As the ground pattern structure 600 has the inclined ground patterns of the first and second diagonal shapes described above, the stress may be reduced in the first region 10. Accordingly, conductive wirings included in the chip on film package 500 may not be damaged such as being separated or cut.

Particularly, an unbent chip on film package 500 is disposed in a plane defined by two directions among the first to fourth directions D1 to D4. In FIG. 7, for example, a vertical direction indicates a thickness direction of the unbent chip on film package 500 and other components of the display device 1000 which are disposed in planes parallel to each other. A portion of the ground patterns within the ground pattern structure 600 are inclined in a direction (e.g., D1 and/or D2) which crosses the third and fourth directions D3 and D4. In FIG. 11, the chip on film package 500 is bent along at least the fourth direction D4 which crosses each of the incline directions of the ground patterns. As such, stress converged in the first region 10 including the inclined ground patterns may be reduced and damage to the conductive wirings in the chip on film package 500 may be reduced or effectively prevented.

Figure 13:
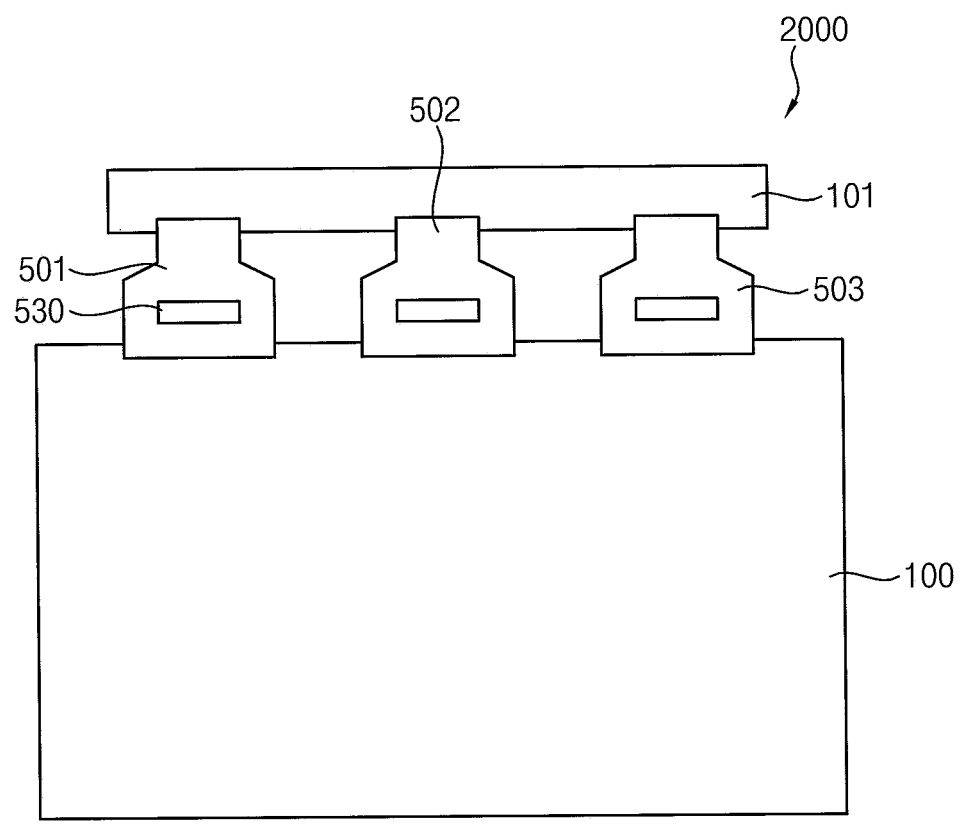
FIG. 13 is a top plan view illustrating another exemplary embodiment of a display device in accordance with the invention.
Figure 14:
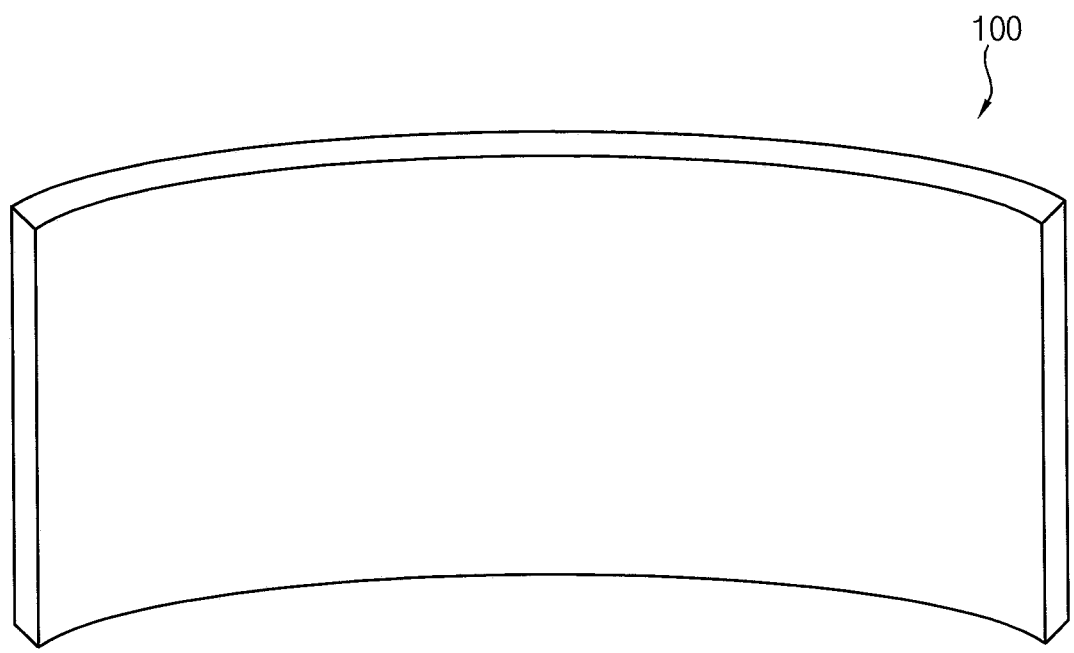
FIG. 14 is a perspective view illustrating an exemplary embodiment of a display panel included in the display device of FIG. 13.

FIG. 13 is a top plan view illustrating another exemplary embodiment of a display device in accordance with the invention, and FIG. 14 is a perspective view illustrating an exemplary embodiment of a display panel included in the display device of FIG. 13. A display device 2000 illustrated in FIGS. 13 and 14 may have a configuration substantially the same as or similar to that of a display device 1000 described with reference to FIGS. 8 through 12 except for three chip on film packages 501, 502, and 503 and a shape of a display panel 100. In FIGS. 13 and 14, detailed descriptions for elements that are substantially the same as or similar to elements described with reference to FIGS. 8 through 12 may not be repeated.

Referring to FIGS. 13 and 14, a display device 2000 may include a display panel 100, a first chip on film package 501, a second chip on film package 502, a third chip on film package 503, and an external device 101.

The chip on film packages 501, 502, and 503 may be connected to a common first side of the display panel 100. The chip on film packages 501, 502, and 503 may be connected to one single external device 101. In an exemplary embodiment, for example, the display panel 100 may correspond to a large-sized display panel having a relatively large size.

In exemplary embodiments, a same one display panel 100 is connected to three chip on film packages, but not being limited thereto. In an exemplary embodiment, for example, a same one display panel 100 may be connected to two chip on film packages or four or more chip on film packages.

In exemplary embodiments, as illustrated in FIG. 14, the display panel 100 may have a curved shape. When the chip on film packages 501, 502, and 503 connected to the display panel 100 having the curved shape are bent to place the external device 101 on a lower surface of the display panel 100, a twist phenomenon of the chip on film packages 501, 502, and 503 may be further increased. In this case, a stress may be further converged in the first region 10 of one or more of the chip on film packages 501, 502, and 503.

As the ground pattern structure 600 in the first region 10 according to one or more exemplary embodiments has inclined ground patterns to define the first and second diagonal shapes, the stress may be relatively reduced in the first region 10. Accordingly, conductive wirings included in each of the chip on film packages 501, 502, and 503 may not be damaged such as being separated or cut.

One or more exemplary embodiment of the invention may be applied to various display devices including a chip on film package 500. In exemplary embodiments, for example, the invention may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A chip on film package, comprising:
   a driving integrated circuit chip from which an electronic signal is provided to a display panel for displaying an image, the driving integrated circuit chip including a first side;
   a base substrate including:
      a driving integrated circuit region in which the driving integrated circuit chip is disposed on the base substrate, the driving integrated circuit region including a first side corresponding to the first side of the driving integrated circuit chip,
      a first region at which stress is converged by the base substrate bent along a side surface of the display panel, located at the first side of the driving integrated circuit region; and
      within the first region at which the stress is converged:
         a first portion and a second portion which is directly adjacent to the first portion along the first side of the driving integrated circuit chip, and
         an electrical ground pattern structure with which the driving integrated circuit is electrically grounded, wherein the electrical ground pattern structure includes:
            a plurality of ground patterns each connected to the first side of the driving integrated circuit chip,
            in the first portion of the first region, ground patterns each inclined with respect to the first side of the driving integrated circuit chip, in a first direction towards the second portion of the first region, and
            in the second portion of the first region, ground patterns each inclined with respect to the first side of the driving integrated circuit chip, in a second direction towards the first portion of the first region.

2. The chip on film package of claim 1, wherein
   the ground patterns extending inclined in the first direction are spaced apart from each other along the first side of the driving integrated circuit chip, and have different lengths from each other, and
   the ground patterns extending inclined in the second direction are spaced apart from each other along the first side of the driving integrated circuit chip, and have different lengths from each other.

3. The chip on film package of claim 1, wherein the ground patterns extending inclined in the first direction and the ground patterns extending inclined in the second direction are symmetric to each other with respect to a center of the driving integrated circuit region along the first side thereof.

4. The chip on film package of claim 1, wherein
   a plane is defined by the first and second directions, and
   in a top view of the plane, the driving integrated circuit chip includes:
      the first side lengthwise extending in a third direction crossing each of the first and second directions;
      a second side facing the first side;
      a third side lengthwise extending in a fourth direction perpendicular to the third direction; and
      a fourth side facing the third side.

5. The chip on film package of claim 4, wherein in the top view of the plane defined by the first and second directions:
   lengths of the first and second sides of the driving integrated circuit chip are each greater than lengths of the third and fourth sides of the driving integrated circuit chip, and
   the first region of the base substrate in which the electrical ground pattern structure is disposed has a shape of an inverted triangle corresponding to an overall shape defined by the plurality of ground patterns.

6. The chip on film package of claim 4, wherein
   each of the plurality of ground patterns within the ground pattern structure is in contact with the first side of the driving integrated circuit chip, and
   ends of the plurality of ground patterns are aligned with each other along the first side of the driving integrated circuit chip.

7. The chip on film package of claim 4, wherein the ground patterns extending inclined in the first direction and the ground patterns extending inclined in the second direction are symmetric to each other with respect to a center of the driving integrated circuit chip along the third direction.

8. The chip on film package of claim 4, wherein the ground patterns extending inclined in the first direction and the ground patterns extending inclined in the second direction are spaced apart from each other along the fourth direction.

9. The chip on film package of claim 4, wherein the base substrate further includes:
   a second region located at a second side of the driving integrated circuit region opposite to the first side thereof;
   third regions spaced apart from each other along the third direction, respectively at opposing sides the second region along the third direction, the third regions respectively extending to be disposed at opposing sides of the first region along the third direction; and
   a fourth region located between the second region and each of the third regions along the third direction, respectively, the fourth region extending to be disposed at opposing sides of the first region along the third direction.

10. The chip on film package of claim 9, further comprising:
   first input wirings which transmit input signals to the integrated circuit chip from outside the chip on film package, disposed on the base substrate in the second region thereof, the first input wirings being spaced apart from each other along the third direction and connected to the second side of the driving integrated circuit chip;
   second input wirings which transmit input signals to the display panel from outside the chip on film package, disposed on the base substrate in each of the third regions thereof, the second input wirings being spaced apart from each other along the third direction; and
   output wirings which transmit the input signals from the integrated circuit chip to the display panel, disposed on the base substrate in the fourth region thereof, the output wirings being spaced apart from each other along the third direction and connected to the driving integrated circuit chip,
   wherein the second input wirings are electrically disconnected from the output wirings.

11. The chip on film package of claim 10, wherein
   the first input wirings are in contact with a portion of the second side of the driving integrated circuit chip, and the first and second ground patterns are each in contact with a portion of the first side of the driving integrated circuit chip,
   the output wirings are in contact with a remaining portion of the first side of the driving integrated circuit chip excluding the portion in contact with the plurality of ground patterns, a remaining portion of the second side of the driving integrated circuit chip excluding the portion in contact with the first input wirings, the third side and the fourth side of the driving integrated circuit chip, and
   in the top view of the plane defined by the first and second directions, at the first side of the driving integrated circuit chip, end portions of the output wirings and end portions of the plurality of ground patterns are disposed parallel to each other.

12. The chip on film package of claim 1, wherein
   the plurality of ground patterns include first through (M)th ground patterns, where M is integer greater than 1, and
   (K)th and (K+1)th ground patterns among the first through (M)th ground patterns are symmetric to each other with respect to a center of the first region along the first side of the driving integrated circuit region, where K is integer between 1 and M.

13. The chip on film package of claim 12, wherein
   the (K)th ground pattern is extended inclined in the first direction, and the (K+1)th ground pattern is extended inclined in the second direction, and
   wherein the (K)th and (K+1)th ground patterns form a V shape.

14. The chip on film package of claim 12, wherein the (K)th and (K+1)th ground patterns have a same length as each other.

15. The chip on film package of claim 12, wherein
   first distal ends of each of the (K)th and (K+1)th ground patterns are aligned with each other at the first side of the driving integrated circuit chip, and
   second distal ends of each of the (K)th and (K+1)th ground patterns which oppose the first distal ends thereof, are adjacent to each other in a direction away from the driving integrated circuit chip.

16. The chip on film package of claim 12, wherein
   a (2M−1)th ground pattern among the first through (M)th ground patterns is disposed in the first portion of the first region, and a (2M)th ground pattern among the first through (M)th ground patterns is disposed in the second portion of the first region, and
   lengths of the (2M−1)th and (2M)th ground patterns decrease in a direction toward a center of the first side of the driving integrated circuit chip.

17. A chip on film package, comprising:
   a driving integrated circuit chip from which a signal is provided to a display panel for displaying an image;
   a base substrate including:
      a driving integrated circuit region in which the driving integrated circuit chip is disposed on the base substrate,
      a first input region in which a first input wiring through which a first input signal is transmitted to the driving integrated circuit chip from outside the chip on film package is disposed on the base substrate, the first input region disposed at a first side of the driving integrated circuit region,
      second input regions in which a second input wiring through which a second input signal is transmitted to the display panel from outside the chip on film package is disposed on the substrate, the second input regions spaced apart from each other and located at opposing sides of the first input region along the first side of the driving integrated circuit chip region, respectively,
      an output region, in which an output wiring through which an output signal is transmitted from the integrated circuit chip to the display panel is disposed on the base substrate, the output region located between the driving integrated circuit region and each of the second input regions, respectively, and
      a first region, located at a second side of the driving integrated circuit region which is opposite to the first side thereof, the first region being surrounded by the driving integrated circuit region and the output region, and
   an electrical ground pattern structure which is disposed in at least one region among the first input region, the second input region, the output region and the first region of the base substrate, the electrical ground pattern structure including:
      first ground patterns inclined in a first direction, and
      second ground patterns inclined in a second direction which is different from the first direction and towards the first ground patterns.

18. The chip on film package of claim 17, wherein the at least one region among the first input region, the second input region, the output region and the first region is a region at which stress is converged by the base substrate bent along a side surface of the display panel.

19. The chip on film package of claim 17, wherein
   the electrical ground pattern structure is disposed in the first region which is surrounded by the driving integrated circuit region and the output region, and
   with respect to the second side of the driving integrated circuit region, each of the first ground patterns extended in the first direction and each of the second ground patterns extended in the second direction is spaced apart from the driving integrated circuit chip.

20. A display device, comprising:
a display panel including a plurality of pixel structures with which an image is displayed by the display panel;
an external device which generates a plurality of signals for controlling the pixel structures to display the image;
a chip on film package through which the signals are provided to the display panel from the external device, connected to a first end of the display panel and bendable along a side surface of the display panel;
wherein
the chip on film package includes:
- a driving integrated circuit chip from which an output signal is provided to the display panel from the external device, the driving integrated circuit chip including a first side,
- a base substrate including:
  - a driving integrated circuit region in which the driving integrated circuit is disposed on the base substrate, the driving integrated circuit region including a first side corresponding to the first side of the driving integrated circuit chip, and
  - a first region at which stress is converged by the base substrate bent along the side surface of the display panel, located at the first side of the driving integrated circuit region; and
within the first region at which the stress is converged,
- a first portion and a second portion which is directly adjacent to the first portion along the first side of the driving integrated circuit chip, and
- an electrical ground pattern structure with which the driving integrated circuit is electrically grounded,
wherein the electrical ground pattern includes a plurality of ground patterns each connected to the first side of the driving integrated circuit chip,
in the first portion of the first region, ground patterns each inclined with respect to the first side of the driving integrated circuit chip, in a first direction towards the second portion of the first region, and
in the second portion of the first region, ground patterns each inclined with respect to the first side of the driving integrated circuit chip, in a second direction towards the first portion of the first region.

* * * * *